US008586410B2

(12) United States Patent
Arnold et al.

(10) Patent No.: US 8,586,410 B2
(45) Date of Patent: Nov. 19, 2013

(54) ENHANCED MAGNETIC SELF-ASSEMBLY USING INTEGRATED MICROMAGNETS

(75) Inventors: David Patrick Arnold, Gainesville, FL (US); Sheetal Bhalchandra Shetye, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 44 days.

(21) Appl. No.: 12/693,337

(22) Filed: Jan. 25, 2010

(65) Prior Publication Data
US 2011/0179640 A1 Jul. 28, 2011

(51) Int. Cl.
*H01L 21/50* (2006.01)
(52) U.S. Cl.
USPC ............ 438/107; 257/E25.001; 257/E25.03; 438/108
(58) Field of Classification Search
USPC ........ 438/3, 107, 108; 257/E24.001–E25.032
See application file for complete search history.

(56) References Cited

U.S. PATENT DOCUMENTS

| 6,162,702 | A * | 12/2000 | Morcom et al. ............... 438/459 |
|---|---|---|---|
| 7,644,489 | B2 | 1/2010 | Arora et al. |
| 2004/0004058 | A1* | 1/2004 | Smith et al. ............... 216/41 |
| 2005/0112614 | A1* | 5/2005 | Cook et al. ............... 435/6 |
| 2006/0202943 | A1* | 9/2006 | Hillis et al. ............... 345/102 |
| 2007/0030220 | A1* | 2/2007 | Hillis et al. ............... 345/84 |
| 2007/0087472 | A1* | 4/2007 | Huber et al. ............... 438/106 |
| 2007/0231949 | A1* | 10/2007 | Huber et al. ............... 438/106 |
| 2008/0023435 | A1* | 1/2008 | Wu et al. ............... 216/2 |
| 2008/0176762 | A1* | 7/2008 | Herold et al. ............... 506/13 |
| 2008/0218299 | A1* | 9/2008 | Arnold ............... 335/306 |
| 2010/0015730 | A1* | 1/2010 | Lian et al. ............... 438/3 |
| 2010/0096640 | A1* | 4/2010 | Kim et al. ............... 257/82 |
| 2010/0219156 | A1* | 9/2010 | Hipwell et al. ............... 216/22 |

OTHER PUBLICATIONS

Faehler et al., "Hard Magnetic Thin Films", 2001 Annual Report of the Leibniz Institute for Solid State and Materials Research, pp. 21-24.*
Morris, C.J., et al., "Self-assembly for Microscale and Nanoscale Packaging: Steps Toward Self-packaging," *IEEE transactions on Advanced Packaging*, Nov. 2005, pp. 600-611, vol. 28, No. 4.
Yeh, H.-J. J., Smith, J.S., "Fluidic Self-Assembly for the Integration of GaAs Light-Emitting Diodes on Si Substrates," *IEEE Photonics Tech. Letters*, 1994, pp. 706-708, vol. 6, No. 6.
Srinivasan, U., et al., "Microstructure to Substrate Self-assembly Using Capillary Forces," *J. Microelectromech. Syst.*, Mar. 2001, pp. 17-24, vol. 10, No. 1.

(Continued)

*Primary Examiner* — Fernando L Toledo
*Assistant Examiner* — Peter Bradford
(74) *Attorney, Agent, or Firm* — Saliwanchik, Lloyd & Eisenschenk

(57) ABSTRACT

Embodiments of the invention relate to a method and system for magnetic self-assembly (MSA) of one or more parts to another part. Assembly occurs when the parts having magnet patterns bond to one another. Such bonding can result in energy minima. The magnetic forces and torques—controlled by the size, shape, material, and magnetization direction of the magnetic patterns cause the components to rotate and align. Specific embodiments of MSA can offer self-assembly features such as angular orientation, where assembly is restricted to one physical orientation; inter-part bonding allowing assembly of free-floating components to one another; assembly of free-floating components to a substrate; and bonding specificity, where assembly is restricted to one type of component when multiple components may be present.

29 Claims, 25 Drawing Sheets

(56) References Cited

OTHER PUBLICATIONS

Edman, C.F., et al., "Electric Field Directed Assembly of an InGaAs LED onto Silicon Circuitry," *IEEE Photonics Lett.*, 2000, pp. 1198-1200, vol. 12, No. 9.

Murakami, Y., et al., "Application of Micromachine Techniques to Biotechnological Research," *Mat. Sci. & Eng. C*, 2000, pp. 67-70, vol. 12.

Böhringer, K.F., et al., "Parallel Microassembly Using Electrostatic Force Fields," *IEEE Int. Conf. Robotics and Automation (ICRA)*, Leuven, Belgium, May 1998, pp. 1204-1211.

Shetye, S., et. al., "Self-assembly of Millimeter-scale Components Using Integrated Micromagnets," *IEEE Trans. Magn*, Nov. 2008, vol. 44, No. 11.

Agashe, J., Arnold, D.P., "A Study of Scaling and Geometry Effects on the Forces Between Cuboidal and Cylindrical Magnets Using Analytical Force Solutions," *J. Phys. D: Appl. Phys.*, May 2008, pp. 105001-1-9, vol. 41.

Bowers, B., et al., "A Method to Form Bonded Micromagnets Embedded in Silicon," in *Proc. 14$^{th}$ Int. Conf. Solid-State Sensors, Actuators, and Microsystems (Transducers 07)*, 2007, pp. 1581-1584.

Wang, N., et al., "Wax-bonded NdFeB Micromagnets for Microelectromechanical Systems Applications," *J. Appl. Phys.*, 2008, pp. 07E109-1-3, vol. 103.

\* cited by examiner

Electrical interconnects on the front

Patterned magnets on the back

ENHANCED MAGNETIC SELF-ASSEMBLY USING INTEGRATED MICROMAGNETS

The subject invention was made with government support under National Science Foundation, Contract No. DMI-0556056. The government has certain rights to this invention.

BACKGROUND OF INVENTION

Embodiments of the subject invention are directed to the use of magnetic forces for self-assembly of three-dimensional structures. Specific embodiments relate to the use of magnetic forces for self-assembly of microfabricated devices on a nanoscale, a micron scale, a millimeter scale, and/or a centimeter scale. Further specific embodiments pertain to the use of magnetic forces for self-assembly of three-dimensional structures for integrated circuits utilizing shaped magnetic fields.

Over the past few decades, advances in the field of electronic and photonic devices for signal processing wireless communication, computing and the like have become more complex as they become more highly integrated. Most systems are an amalgam of heavily integrated microsystems. These systems are enabled by careful integration of sub-systems of various physical size and function into compact modular devices. By way of example, the cellular phone tightly integrates CMOS electronics, RF components, photonics, micro-electro-mechanical systems (MEMS), passive discrete components, power supplies and circuit boards to enable wireless communication, data processing/storage and signal processing functionalities. The trend is for smaller, more compact, more integrated and more complex devices.

It is currently known in the art to create these devices by separately fabricating each of the components, through mutually incompatible processes, and then assembling into the sub-assemblies. For example, the semiconductor devices are batch fabricated using wafers having hundreds or thousands of individual components.

Reference is made to FIG. 1A in which a schematic of a known assembly process is shown. Semiconductor devices are batch fabricated using wafers 10. After microfabrication, the wafers are diced and possibly packaged into subcomponents 12. In parallel with the semiconductor processing, passive electrical components such as capacitors, inductors, and resistors, as well as circuit boards 14 are fabricated. After individual fabrication, all of the system subcomponents are assembled serially onto the circuit boards utilizing human manipulation, or more commonly robotic "pick and place" systems to form the completed electrical circuit board 15. This method has been satisfactory; however, it suffers from the disadvantage that the large number of components that can be batch manufactured overwhelm the throughput capabilities for the serial back-end packaging and assembly. Because of the serial nature, the throughput is limited by the number and speed of the robotic manipulators. Secondly, the shrinking physical size of the microelectronics, down to the micro- or nanoscale in many applications, requires precise manipulation. As components become smaller, the absolute alignment positioning tolerances scale equivalently; sometimes beyond the capabilities of robotic manipulation.

Lastly, for sub-millimeter parts, the adhesion forces between the part and the manipulator are significant compared to gravity, resulting in a sticking problem.

Self-assembly has been utilized to a small extent during the packaging and preparation process when forming components onto substrates. Self-assembly is the autonomous organization of components into patterns or structures without human intervention. It is the assembly of parts onto a fixed substrate or the assembly of homogeneous or heterogeneous mixtures of parts one to another. The process is inherently stochastic, relying on the random distribution, mixing and physical interactions between the parts.

The self-assembly processes are governed by two fundamental forces, one being played against the other. Namely, the two forces are the mixing forces causing the large-scale mechanical movement between the parts to be assembled and short-range bonding forces causing the parts to assemble to one another when in close proximity. To maintain a bond, the short range bonding force must be greater than the mixing force to provide a stable connection. The short range bonding force must also be sufficient to overcome other external forces that may act to separate the parts, such as gravity, surface tension, buoyancy, electrostatic forces or the like. Alignment of the parts in self-assembly is typically dependent on minimization of the total free energy.

It is also known in the art to effect mixing by fluid flow (typically for wet assembly) or by vibration energy (typically for dry assembly). Short-range bonding forces have taken the forms of gravity, electrostatic forces, magnetic forces, and capillary forces. It should be noted that the forces need merely be sufficient to temporarily hold two pieces of interest together even in the presence of the mixing forces. Once the parts have been assembled, permanent, mechanical and electrical connections can be made through the curing of polymer-based adhesives or reflowing of solder bumps.

More particularly, it is known to use electrostatic forces to more efficiently direct and hold one part to another. In one prior art embodiment, pattern electrodes have been formed on the surface of at least one of the parts to create electric field traps to capture and surface mount components and LEDs on silicon substrates. This method has been satisfactory; however, it requires the formation of an electrical circuit in a desired pattern on the substrate. This adds complexity to the structure of a substrate, is often substrate-limited, i.e., is too difficult to use between two free-floating bodies, and requires the input of energy.

One way of overcoming this shortcoming is to create direct forces between the component and the substrate such as magnetic forces. It is known in the art to use magnetic forces to self-assemble 50 µm nickel disks coated with immobilized biomaterials into an array of nickel disk pattern on the substrate. However, in the prior art, the magnetic forces were the result of the entire structure being a magnet where the structures were attracted to each other, but there is no control over selectivity, or interaction. Furthermore, the magnetic approach was also limited to substrate bonding, not to free floating bodies.

To overcome the shortcomings of these self-assembly structures and methods, capillary forces have also been used to drive self-assembly. At small scales, the capillary forces become dominant. The hydrophilicity of various regions of a surface is controlled to pattern liquid films on a substrate. When a hydrophilic contact pad on one side of a part comes in contact with a liquid droplet, the pad spontaneously wets, and capillary forces draw the part into alignment, thereby minimizing the fluidic interfacial surface energy. This technique has come into vogue to assemble small parts onto planar surfaces with submicron precision for micromirror arrays, inductors and micropumps by way of example.

These techniques and methods for manufacture have been satisfactory; however, they do not match the full functionality offered by robotic or human part manipulation such as orientational uniqueness, bonding selectivity, or inter-part bonding. As a result, they limit the basic logical design rules available for a designer in the self-assembly process.

To provide orientational uniqueness, the method must restrict part bonding to a unique physical orientation between the two bodies to be bonded. As a result, process yield is improved by minimizing the number of misaligned, misfit or incorrectly bonded (e.g., upside down) bonds. Orientational uniqueness is necessary to ensure physically symmetric parts are bonded in the desired orientation to allow complex mating of interconnecting structures.

In the prior art, bonding forces would be sufficient to dominate the mixing forces even if incorrectly aligned. In other words, certain incorrect orientations may result in a local minimization of energy, and the mixing energy is insufficient to move the part into the desired orientation to achieve the global energy minimum. Furthermore, for bonding approaches that have geometric symmetry, energy minimization may occur even in more than one physical orientation.

The gravity driven self-assembly process has attempted to overcome this issue. This is done by giving a specific shape to the receptor site hole. However, these approaches require parts with large scale asymmetrical physical geometries, adding cost and complexity to the batch manufacture process. In the capillary driven self-assembly method, asymmetric bonding interfaces have been implemented, but the alignment precision decreased and the process yields dropped by nearly 70%. The drop in yield is attributed to local energy minima creating misfits and the reduced precision was attributed to a less sharp dip in the energy curve.

The self-assembly method must also lend itself to bonding selectivity, i.e., that the desired part bond with its intended mating part, but not with a third unintended part. Each of the gravity, electrostatic, electric field trap, and capillary methods can be adapted to provide bonding selectivity based on geometric shape, electromagnetic properties, surface and hydrophilicity between the parts.

By way of example, for capillary driven assembly methods, a method has been developed for activating or deactivating certain receptor sites for the self-assembly of different components using sequential steps. Although allowing bonding selectivity, it requires substantial processing and precludes parallel assembly of heterogeneous mixtures. Furthermore, this sequential process lengthens the assembly process as a function of the number of different components.

For a gravity driven self-assembly, shape-matching techniques have been used to effect bonding selectivity for parallel self-assembly of a heterogeneous mixture of three different parts. It is comparable to the approach of a square block, which will not fit, into the proverbial circular hole. However, the number of mutually exclusive shapes may be limited and chip real estate may be wasted as a result of the need for size differentiation as one shape differentiator. Furthermore, the machining of arbitrarily shaped parts imposes additional processing complexity and cost. Therefore, the prior art provides no real solution for the bonding selectivity issue and the requirement in more complex applications for sequential selective bonding in a parallel process.

A self-assembly process should also enable inter-part bonding, namely that free floating parts bond to other free floating parts, rather than to fixed substrates. With respect to inter-part bonding, the electric field method becomes inapplicable with its requirement of the application of an electric charge to at least one of the bodies.

Inter-part bonding further requires the ability to bond in any arbitrary direction. Because of this, gravity-driven processes are inapplicable because gravity only acts in one direction. A collection of free floating parts would have no driving force to bond to one another unless oriented so that gravity is in the direction of at least one of the parts. As a result, short-range bonding forces must exist intrinsically between the parts, not from some externally applied source.

A secondary challenge for inter-part bonding is preventing agglomeration, where parts of a similar type inadvertently bond to each other rather than to the specified receptor site. As a result, capillary-driven assembly is inapplicable because agglomeration requires that there are no short range bonding forces between similar parts, while insuring there are bonding forces between dissimilar parts. If parts of a first type must have a wetted receptor, they will agglomerate to each other while the "dry" second type would not agglomerate.

For a capillary-driven self-assembly approach, it has been demonstrated that a two-step sequential self-assembly of encapsulated LED structures using shape- and solder-directed processes of free floating parts may overcome the inter-part bonding issue. The agglomeration problem is overcome by recessing the wetted receptor sites and cavities and limiting access to only the smaller parts that are intended to be bonded. Solder may also be used as the bonding liquid in a way that solid solder bumps are patterned at the wafer level and heated to melt to form wetted contacts on each of the individual components. When cooled, the solder also serves as the permanent electrical and mechanical contact. This process has been shown to have potential to be satisfactory, however, it suffers from the drawback that it requires sequential assembly steps and the limitation of a single electrical contact between the individual parts and the requirement for parts of dissimilar size to prevent agglomeration.

Accordingly, a method and structure for overcoming the shortcomings of the prior art and allowing self-assembly between two bodies while providing orientational uniqueness, bonding selectivity and inter-part bonding is desired.

BRIEF SUMMARY

Embodiments of the invention relate to a method and system for magnetic self-assembly (MSA) of one or more parts to another part. Assembly occurs when the parts having magnet patterns bond to one another. Such bonding can result in energy minima. The magnetic forces and torques—controlled by the size, shape, material, and magnetization direction of the magnetic patterns cause the components to rotate and align. Specific embodiments of MSA can offer self-assembly features such as angular orientation, where assembly is restricted to one physical orientation; inter-part bonding allowing assembly of free-floating components to one another; assembly of free-floating components to a substrate; and bonding specificity, where assembly is restricted to one type of component when multiple components may be present.

DETAILED DISCLOSURE

Embodiments of the invention relate to a system and method incorporating magnetic forces for self-organizing and assembling small microfabricated parts. With respect to specific embodiments, such assembling can be accomplished without using human or robotic manipulation. Further embodiments relate to assembly of multiple chips manufactured using different, often incompatible processes, e.g., MEMS, CMOS, electro-optics, RF components, and micro-batteries to form hybrid multi-chip microsystems. Additional embodiments can be used to assemble small chips onto other substrates or package bodies. A specific embodiment involves RFID tags, such that small RF chips manufactured at high density are assembled onto larger palletized substrates.

Embodiments can utilize magnets integrated into the micropart itself. The integrated magnetic pads can provide an attractive force causing the chips to bind to receptor sites. Hard-magnet to hard-magnet attraction, e.g., two refrigerator magnets, and/or hard-magnet to soft-magnet attraction, e.g., a refrigerator magnet and a ferrous (soft-magnetic) material, can be utilized.

Small magnetic components can easily be integrated into chips at the wafer level using standard microfabrication processes. Certain "magnetic micro-pads" can be patterned alongside other conventional solder-bumps and/or on the back side of the part or substrate. During self-assembly, the magnetic pads, or magnetic patterns on each part, can align and hold the parts in place for subsequent heating of the solder bumps. Once complete, the solder joints, or other mechanisms, can provide the permanent mechanical and/or electrical connections. In a specific embodiment, the heating step for heating the solder bumps can be used to simultaneously reduce, or minimize the magnetization, "turn off", the micromagnets. Examples of mechanisms for reducing, or minimizing the magnetization of the micromagnets include, but are not necessarily limited to, exceeding the magnetic Curie temperature, disrupting the crystallography, diffusion of other species, and/or chemical reaction with other surface materials.

Specific embodiments can provide one or more of the following benefits: easily integrated by low-cost wafer-level microfabrication process; uniquely-oriented and selective bonding may be achieved through design of the locations of the integrated micromagnetics; functionality in either wet or dry environments.

Figure 3:
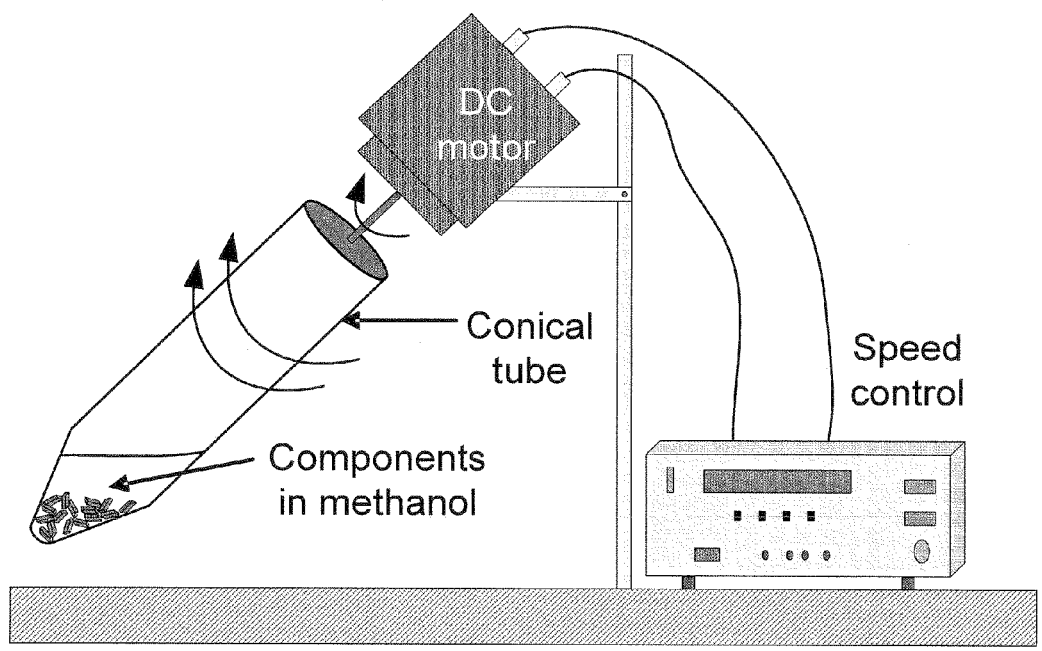
FIG. 3 shows an experimental set-up for part-to-part magnetic self-assembly, in accordance with an embodiment of the subject invention.

Referring to FIG. 3, an embodiment of a system for mixing two or more types of components is shown. This tumbler-like setup can be used for part-to-part magnetic self assembly. Referring to FIG. 3, the parts to be assembled and the excess parts are mixed together in methanol in a rotating conical tube. The tube is connected to the shaft of the dc motor which enables it to rotate at a speed of about 60 rpm. The tube is inclined to an angle of 35°-45°. The methanol reduces, or prevents, the parts from sticking to the tube surface and can also mitigate air bubble formation. When the tube rotates, the parts tumble over each other and self-assemble as the intermagnetic forces overcome the mixing forces. Parts with opposite polarities self-assemble and like parts repel each other, so there is reduced, if any, agglomeration. Although methanol is used in the system of FIG. 3, other fluids, such as air, water, or other solvents can be used, and a vacuum environment can be used as well.

Figure 5:
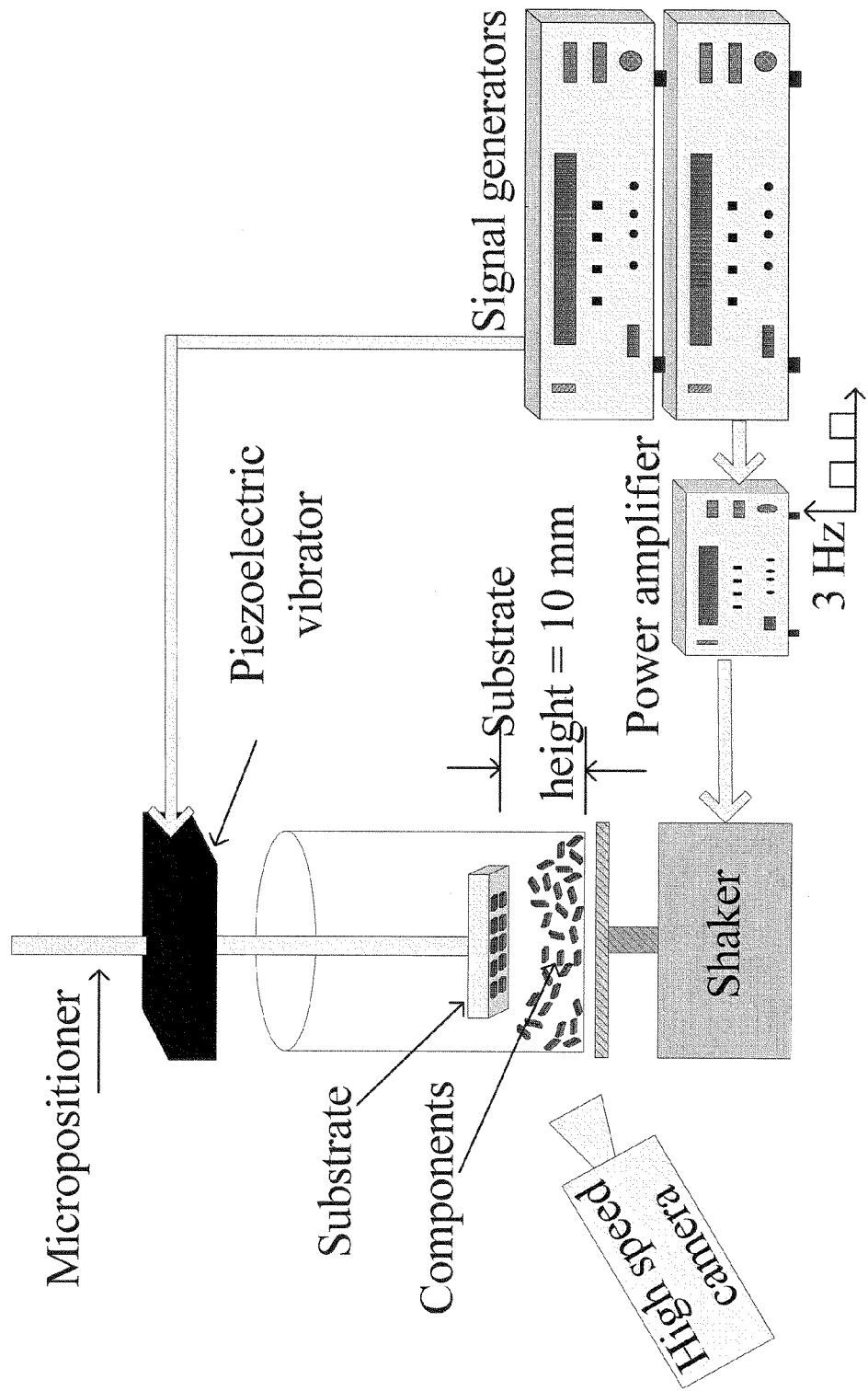
FIG. 5 shows an experimental set-up for part-to-substrate magnetic self-assembly, in accordance with an embodiment of the subject invention.

Referring to FIG. 5, an embodiment for exposing one or more types of components to a substrate is shown. The one or more types of components, or parts, are placed in a glass vial, which in turn is mounted on a shaker. The substrate with its face down is lowered into the glass vial. In a specific embodiment, as shown in FIG. 5, the substrate is lowered via a micropositioner. Other apparatus can also be used to position the substrate. The input to the shaker can be, for example, a square wave fed from a signal generator through an amplifier. The shaker causes the parts to bounce and come into sufficient proximity to the substrate to assemble onto the inverted substrate. In further embodiments, the parts are not shaken, but maybe, for example, facing up so that bringing the substrate near the parts allows self-assembly. Although the substrate is shown inverted so as to have the contact surface facing down, the substrate can be at an angle such that the contact surface faces downward at an angle other than horizontal, or the contact face can also face up, either flat or at an angle. If the contact face faces up the parts can be, for example, poured over the contact face. In a specific embodiment, another shaker or vibration apparatus is used to cause the substrate to vibrate. In alternative embodiments, the substrate is not vibrated. In the embodiment shown in FIG. 5, a piezoelectric vibrator is in contact with the down rod to the inverted substrate. The piezoelectric vibrator provides active vibrations to the substrate during the assembly process, aiding the fine self-alignment of already assembled components and rejection of incorrect assemblies. These active vibrations can also help reduce or eliminate stacking of parts, where stacking is the undesired assembly of an extra part on the back of an already assembled part. The amplitude and the frequency of the piezo vibrator can be tuned by trial and error and can depend on one or more characteristics of the system, such as the bonding force between the parts being assembled, the bonding force of parts that may stack, and the force needed to allow assembled parts to move in order to achieve more fully correct alignment. A camera can be used to capture and record the data into a computer for further analysis such that, for example, the amplitude and frequency of the substrate vibrations can be time tuned.

Figure 12:
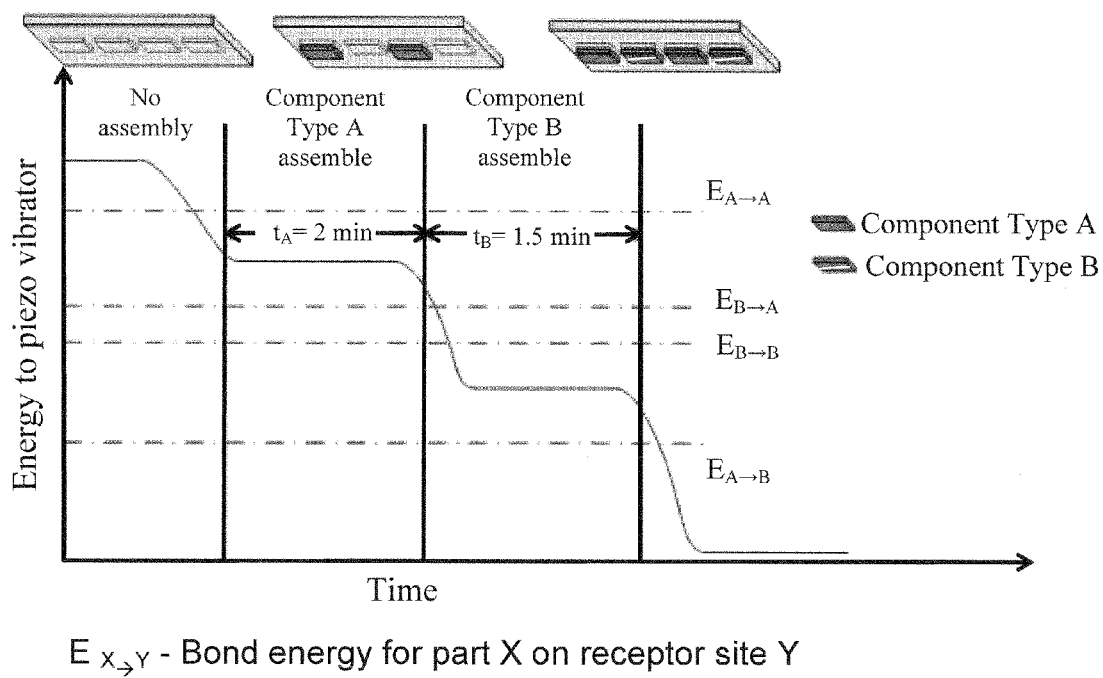
FIG. 12 shows a curve showing the energy applied to a piezoelectric vibrator that vibrates the substrate during a sequential magnetic self assembly process, where component type A is assembled first and component type B is assembled second.
Figure 13:
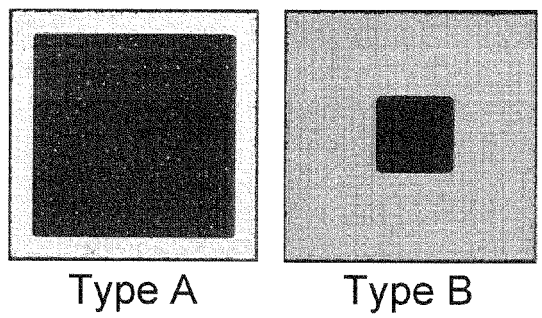
FIG. 13 shows two types of components for simultaneous magnetic self assembly onto a substrate, where type A has a magnet pattern that fills a large portion of the surface area of the bonding surface and type B has a magnet patter that fills a small portion of the surface area of the bonding surface and where both type A and type B components have a 4-fold symmetry.
Figure 14:
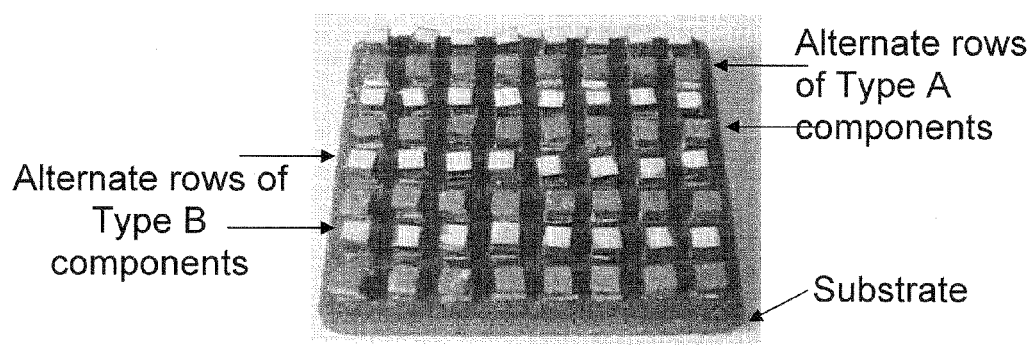
FIG. 14 shows a substrate after simultaneous magnetic self assembly of type A and type B components shown in FIG. 13.
Figure 15:
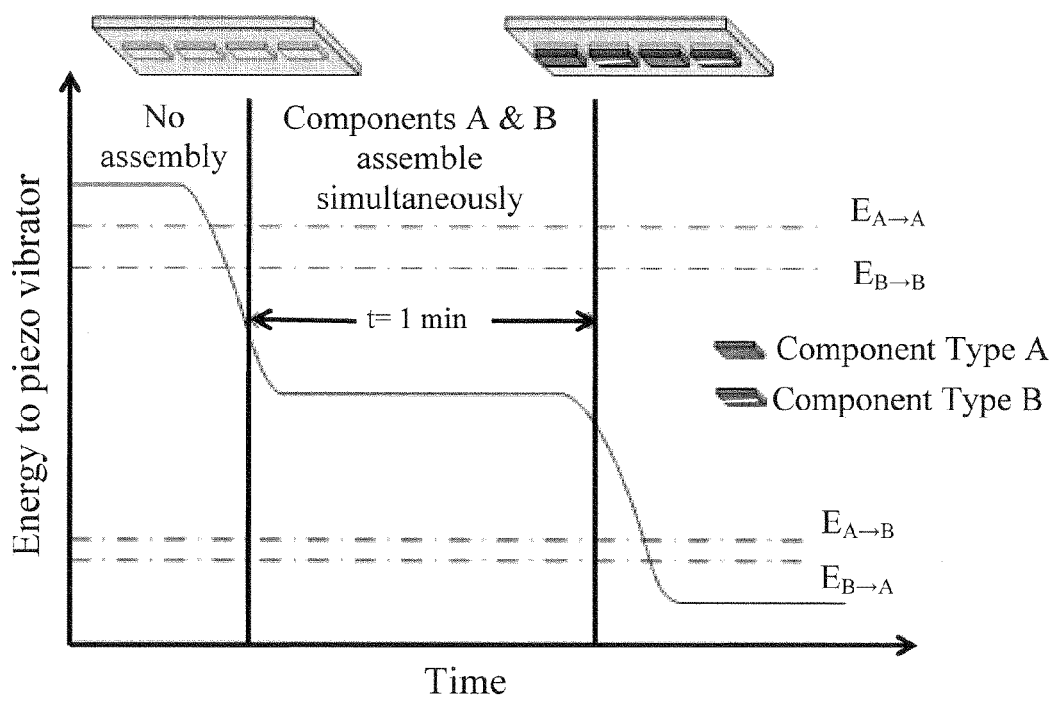
FIG. 15 shows a curve showing energy to a piezoelectric vibrator that vibrates the substrate during simultaneous magnetic self assembly of type A and type B components shown in FIG. 13.

FIGS. 12 and 15 show energy versus time for sequential and simultaneous assembly, respectively, using a setup such as shown in FIG. 5, for specific embodiments of the invention. In FIG. 12, neither component will assemble when a sufficiently high energy is input to the substrate via the piezo vibrator and then when the input energy is lowered part type A assembles. At this time type A only or type A and type B parts can be exposed to the substrate, but only type A parts will assemble. After a sufficient amount of time for type A parts to be assembled the energy of the piezo shaker can be lowered and type B parts can be exposed to the substrate. Referring to FIG. 15, the energy input to the piezo is lowered such that both type A and type B parts can assemble and type A and type B parts are simultaneously exposed to the substrate. In an embodiment, the piezo vibrator can vibrate at frequencies in the range of 500 Hz-2500 Hz, and in a specific embodiment at 900 Hz. The vibrations can be out of plane, in plane, and/or rotational.

Figure 16B:
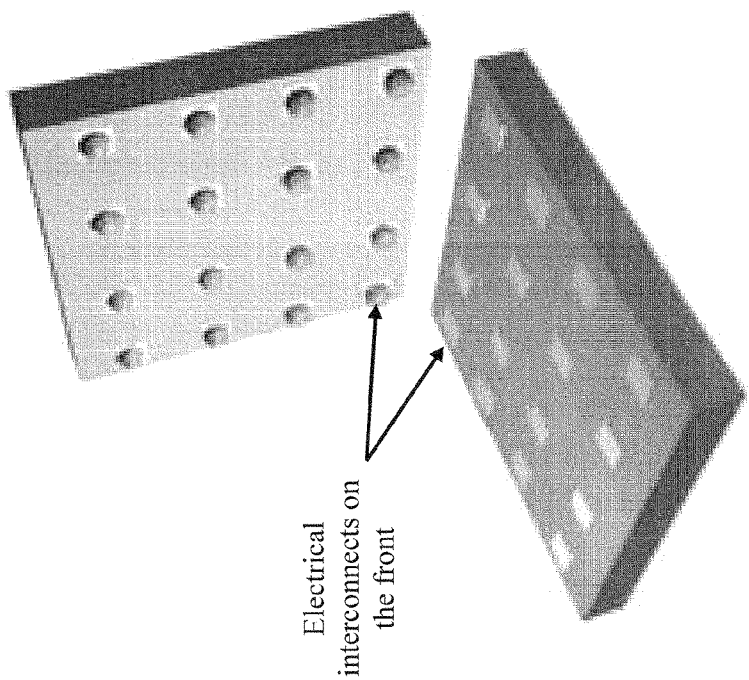
FIGS. 16A and 16B show a specific embodiment of complementary parts having electric interconnects on a front, or contact surface, and patterned magnetics on a back, or non-contact, surface.
Figure 16A:
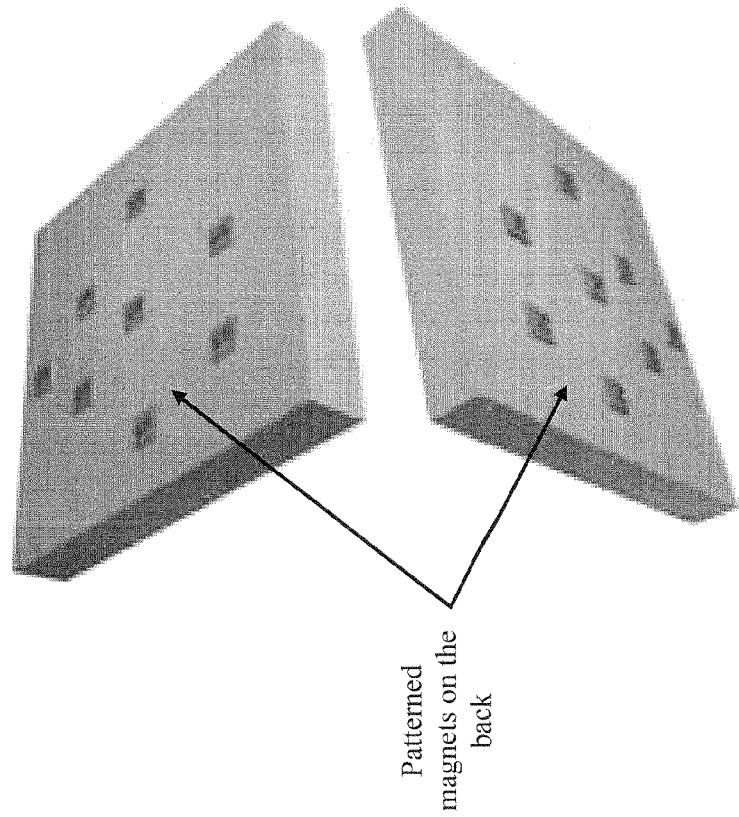

In specific embodiments, the magnets can be fabricated on the front side/bonding face of the components and substrate. In this way, the magnets and the electrical interconnects can be on the same side of the components. In alternative embodiments, which can be referred to as back side processing, the magnets can be fabricated on the back side of the component and/or substrate. FIGS. 16A and 16B show a specific embodiment where fabrication of magnetics on the handle wafer and electrical interconnects on the device layer of a SOI wafer allows removal of the magnets after self-assembly of the parts by etching the buried oxide layer. Fabricating the magnets on the back side of the component and/or substrate allows more space on the front side of the components and/or substrates for electrical interconnects and other features. In specific embodiments, the magnetic fields pass substantially, or completely, unaltered through materials used for the microcomponent fabrication. In an embodiment, the substrate can include materials that do not have Ni, Fe, or Cobalt, in order to allow the magnetic fields to pass freely through the substrate. In a specific embodiment, substrate materials include silicon, glass, and/or circuit board material. FIGS. 16A and 16B show and embodiment where both complimentary components have magnets on the back side and electrical interconnects on the front side. Alternative embodiments can have a substrate or one part, or component, having one or more magnets on the back side and the other complimentary parts having magnets on the front side. Components can also have magnets on both the front side and the back side. In further embodiments, magnets can also be on the sides and/or embedded on the back side.

The magnets on the components and/or substrate can serve the purpose of assembling the components. After assembly, there may not be any further use of the magnets. Further the magnets may create undesirable magnetic fields after assembly that may interfere with any operations of the sensitive devices. After assembly and permanent mechanical attachment (e.g., with solder) the magnets may be partially or wholly removed and/or partially or wholly demagnetized. For example, the magnets can be chemically or mechanically etched away or "lifted off" and/or heated to cause demagnetization.

Figure 17:
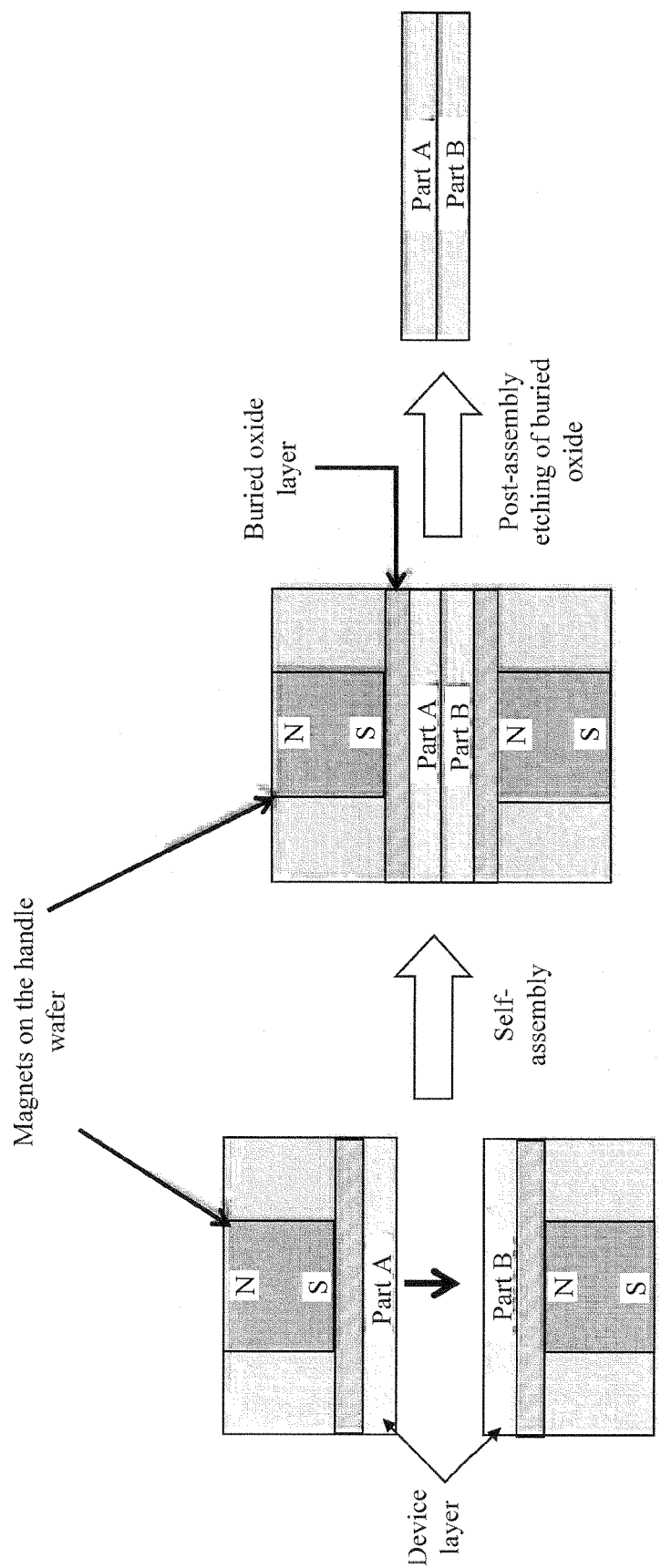
FIG. 17 shows a specific embodiment where fabrication of magnetics on the handle wafer and electrical interconnects on the device layer of a SOI wafer allows removal of the magnets after self-assembly of the parts by etching the buried oxide layer.

In a specific embodiment, referring to FIG. 17, fabrication can occur on a silicon on insulator (SOI) wafer where the magnets can be fabricated on the handle wafer, and the electrical interconnects can be on the device layer of the SOI wafer. After self-assembly, the buried oxide layer can be etched by using a wet etchant, such as buffered oxide etch (HF acid). This technique can enable extremely thin stacks of CMOS devises, which can be used for "3D integration".

Figure 18:
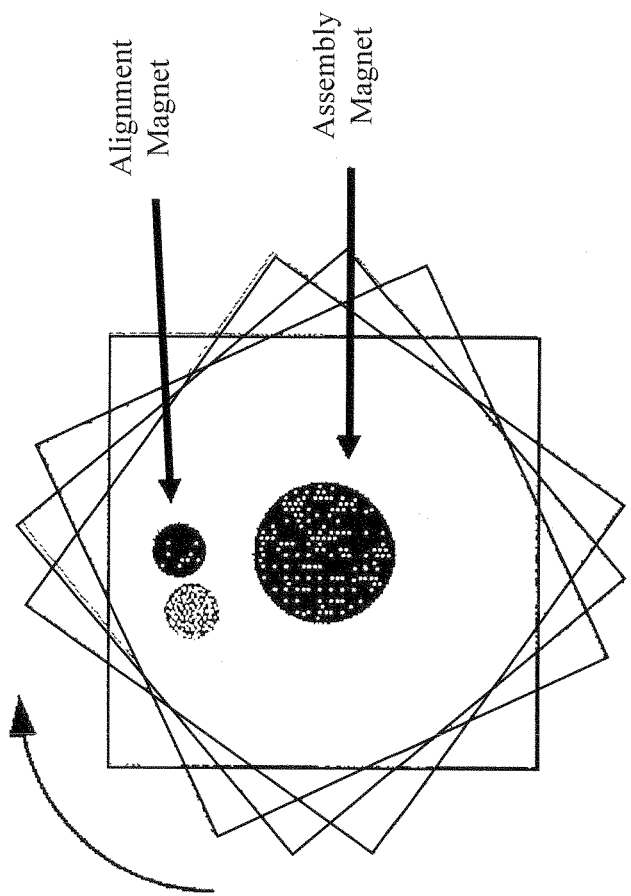
FIG. 18 shows an embodiment incorporating an assembly magnet and an alignment magnet, such that the assembly magnet can allow preliminary assembly and the alignment magnet can allow precise angular alignment.
Figure 18:
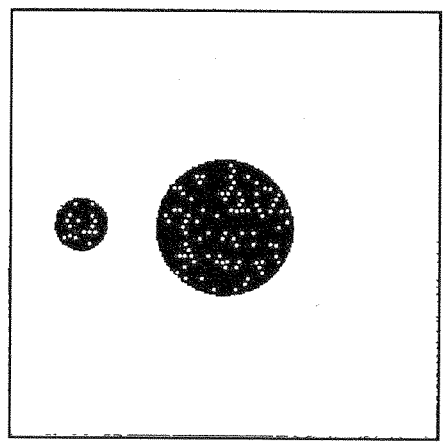

In a specific embodiment, hierarchal size-scales in the magnet pattern can be implemented, such that, for example, the components are patterned with one or more large magnets and one or more small magnets. The large magnet can allow preliminary assembly and one ore more small magnet can be used for precise angular and/or lateral alignment. In a specific embodiment, referring to FIG. 18, a component can have a large, circular magnet, for preliminary assembly and a smaller, circular, adjacent magnet for precise angular alignment. The substrate or complimentary component can have a complimentary large and small magnet. Referring to FIG. 18, the components initially assemble due to the interactions between the large magnets, and, due to substrate vibrations or other stimulus, such as application of magnetic field, the parts further rotate and/or laterally shift and lock into place when the small magnets align. Applying an external magnetic field after preliminary assembly can reduce the force holding the two parts together and, with or without vibration, can allow the alignment magnets to further align the two parts which may be a part magnetically holding to a substrate. Although not shown in FIG. 18, a third or further precise alignment magnet can be used for further precision in the alignment. Vibration of the substrate can allow the parts to move relative to each other under the force of the magnets. Such vibrations can be provided via a variable energy source such that the vibrations can start larger and get smaller with time. This technique can improve both the assembly rate and the yield.

Figure 19:
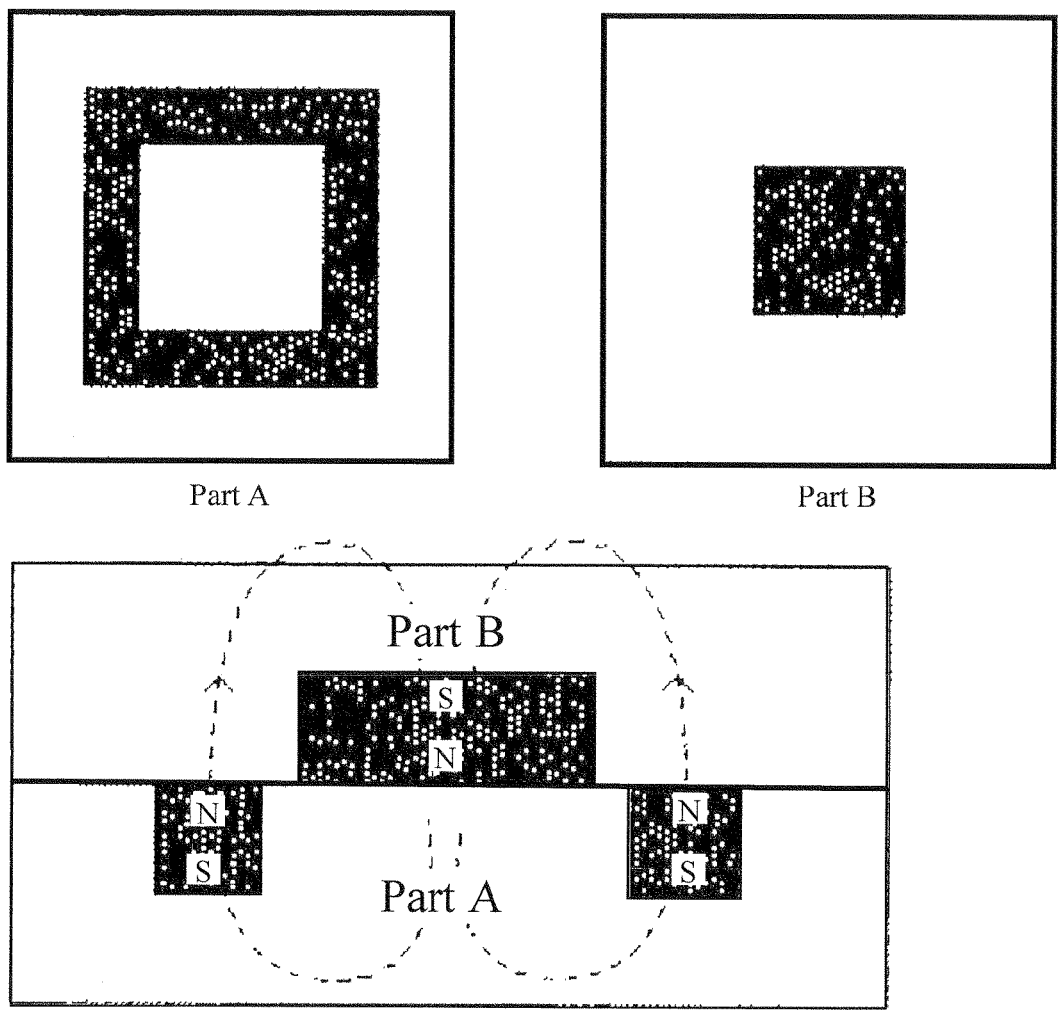
FIG. 19 shows a specific embodiment of a pair of components that magnetically bond such that, during assembly, the part and the substrate magnets, or the two part magnets, do not overlap.

In a specific embodiment, both the part or component and the substrate magnets, or the magnets of complementary parts, are magnetized in the same direction such that the same magnetic pole, N or S, emanates from the contact surfaces. FIG. 19 shows a specific embodiment of a pair of components that magnetically bond such that, during assembly, the part and the substrate magnets, or the two part magnets, do not overlap. Instead, the part B magnet gets latched between the part A magnet. In the overlap position the magnets repel each other, tending to push the part B magnet towards the center of the part A magnet. There are a variety of magnetic patterns that complimentary parts can have so as to self assemble with each other in accordance with embodiments of the invention.

Figure 20:
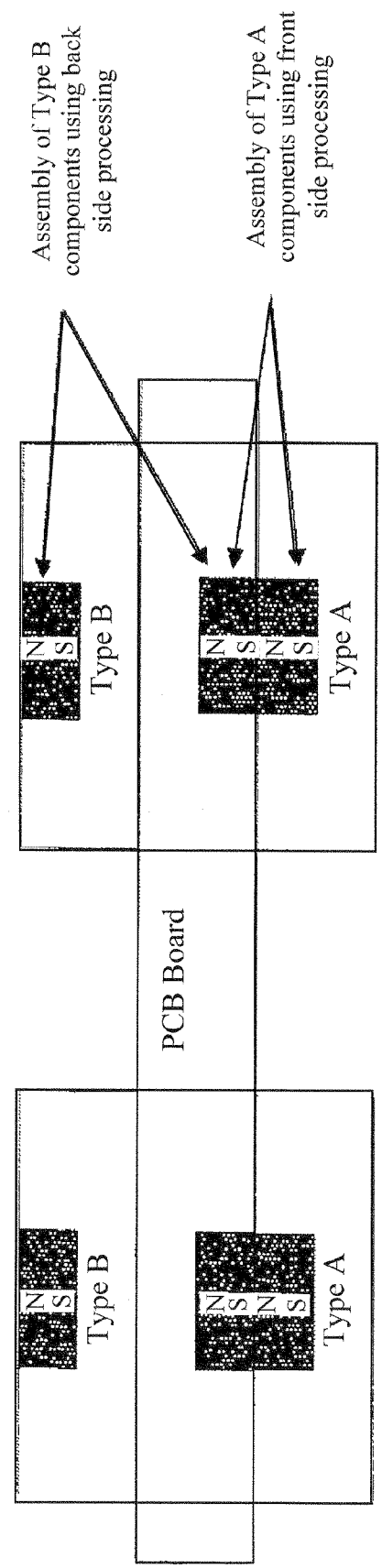
FIG. 20 shows an embodiment where type A components are assembled using front side processing, i.e., the magnets and the electrical interconnects are on the bonding face of the components, and type B components are fabricated using back side processing, i.e., the magnets are on the back side of the components and the electrical interconnects are on the front side or the bonding side of the component.

In a specific embodiment, parts can be assembled on both sides of a substrate and, optionally on one or more sides of the substrate. Referring to FIG. 20, type A components are assembled using front side processing, i.e., the magnets and the electrical interconnects are on the bonding face of the components, and type B components are fabricated using back side processing, i.e., the magnets are on the back side of the components and the electrical interconnects are on the front side or the bonding side of the component. In this embodiment, once type A components are assembled, assembly of type B components is carried out. In other embodiments, both sides can be assembled simultaneously. Assembly can also be expanded to 3D assembly. Other permutations of front side and back side magnets can be utilized in accordance with the teachings herein.

Self-assembly on front and back sides of a substrate can dramatically reduce manufacturing costs by eliminating the need for robotic manipulation of very small parts, thus reducing the overall device cost. Furthermore, it enables the processing of millions or billions of parts in a parallel, rather than sequential, fashion. This technique can be used for RFID tagging various goods.

Figure 21:
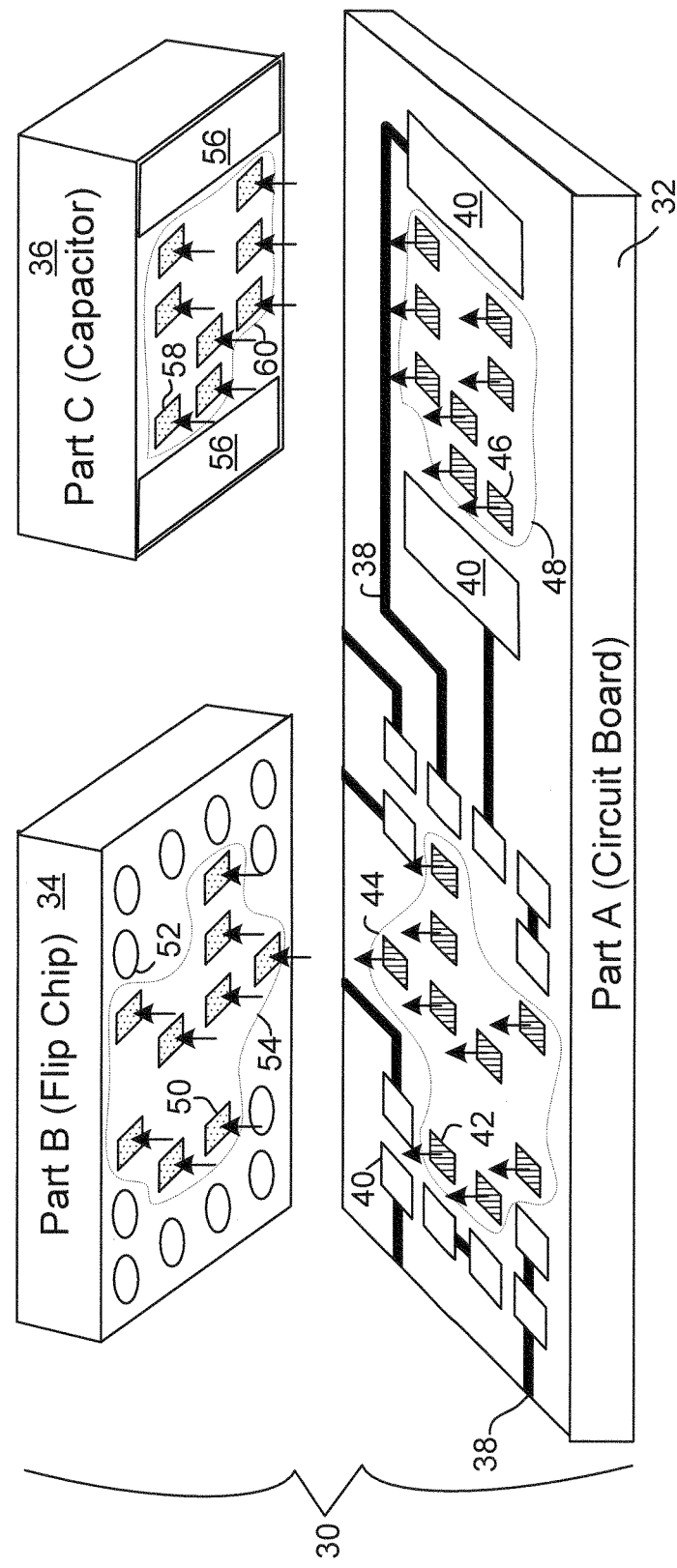
FIG. 21 is an exploded perspective view of a self-assembled circuit constructed in accordance with the invention.

Reference is now made a specific embodiment, shown in FIG. 21, in which an assembly, generally indicated as 30, includes a first member 32, a second member 34 and a third member 36. First member 32 is a printed circuit board; the circuit having a generic flip chip circuit and capacitor by way of example mounted thereon. Circuit board 32 is provided with circuit structure including wiring or trace leads 38 conductively coupled to solder bumps 40 to allow electrical connection with other members 34, 36. Circuit board 32 (interchangeably referred to as first member 32) includes a first plurality of magnets 42 arranged in a pattern 44 to provide a shaped magnetic field. Circuit board 32 also includes a second plurality of magnets 46 arranged in a second pattern 48.

Second member 34, in this embodiment a flip chip, is formed with a plurality of magnets 50 thereon and solder bumps 52. Magnets 50 are provided in a predetermined pattern 54, which is the mirror image of pattern 44 to provide a mirror shaped magnetic field.

Similarly, member 36, a capacitor in this example, includes solder bumps 56 and a plurality of magnets 58 in a pattern 60 which is the mirror image of pattern 48.

Magnetic forces arise between the patterns of magnets as a result of the interaction of the magnetic fields between any two magnets. The magnetic fields are related to the material. While all materials have magnetic properties, what are commonly referred to as magnets are typically ferromagnetic in nature and can be classified as either hard or soft magnets. Hard magnetic materials possess a strong permanent magnetization, while soft magnetic materials incur a strong magnetization only upon the application of an external magnetic field. The use of different magnetic materials possessing different magnetic properties and strengths provides flexibility in the design.

By utilizing complimentary magnetic field patterns, a magnetic "lock and key" matching mechanism is provided. The size, shape, material type, and number of the individual magnets can be used to control the total magnetic patterns of the magnets, resulting in complex magnetic force field interactions, permitting a degree of pattern-matching between the components.

If sufficiently asymmetric and diverse patterns are generated, it enables orientational uniqueness, bonding selectivity and inter-part bonding. These capabilities are achieved simultaneously in one massively parallel self-assembly step. In an embodiment, agglomeration is prevented because the individual magnets for any given component type are magnetized in the same direction (e.g., all having north or south polarities for the hard magnets). In additional embodiments, more complicated magnetic field patterns are utilized with agglomeration prevented as the magnetic attraction between parts of the same type are lower than the mixing force used. Thus, parts of the same type will repel each other, increasing the overall speed of the matching process while preventing misalignment of two bodies.

Figure 23:
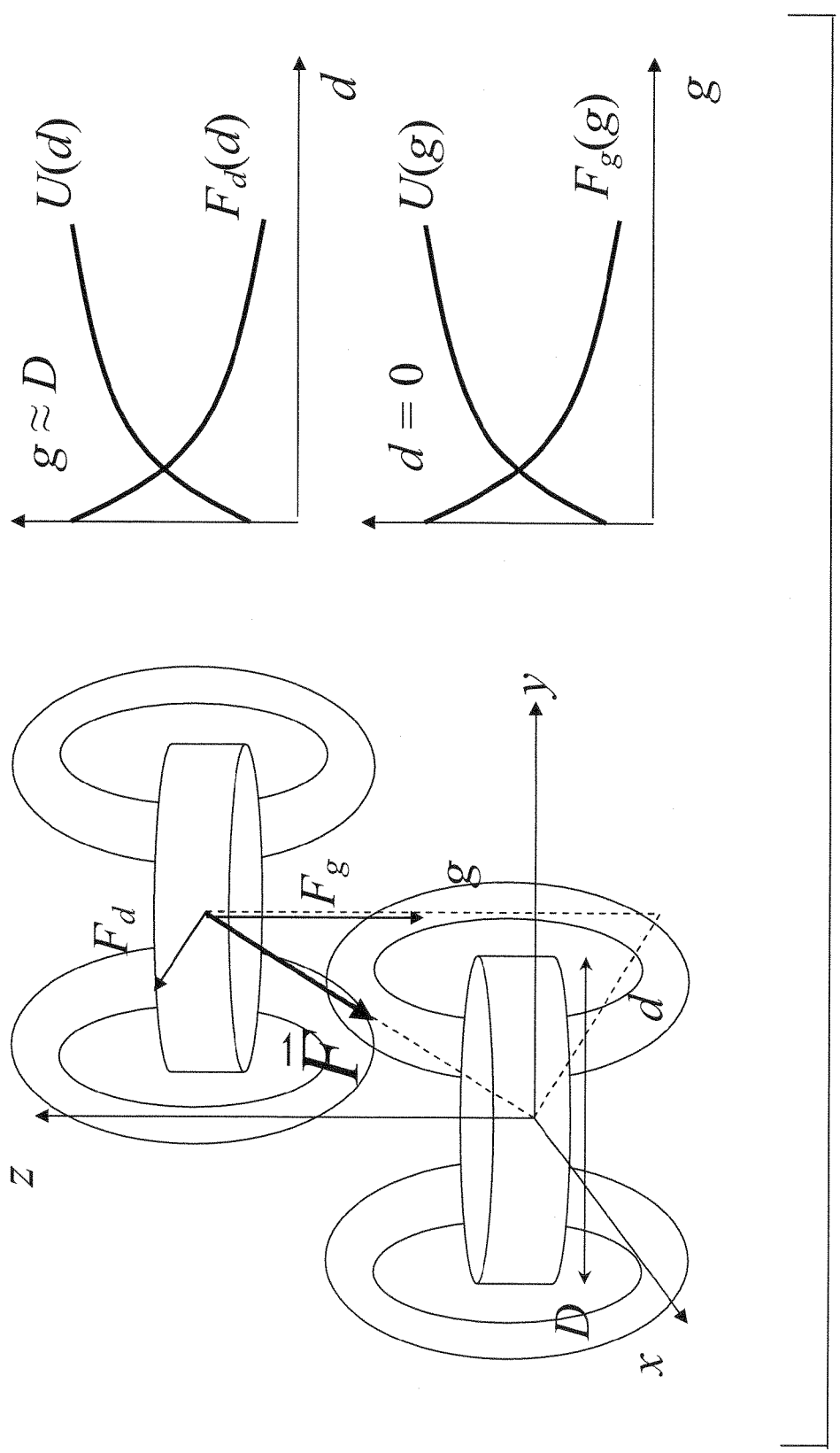
FIG. 23 is a graphical representation of the magnetic forces and potential energy between two uniformly magnetized permanent magnets for demonstrating an aspect of the invention.
Figure 24:
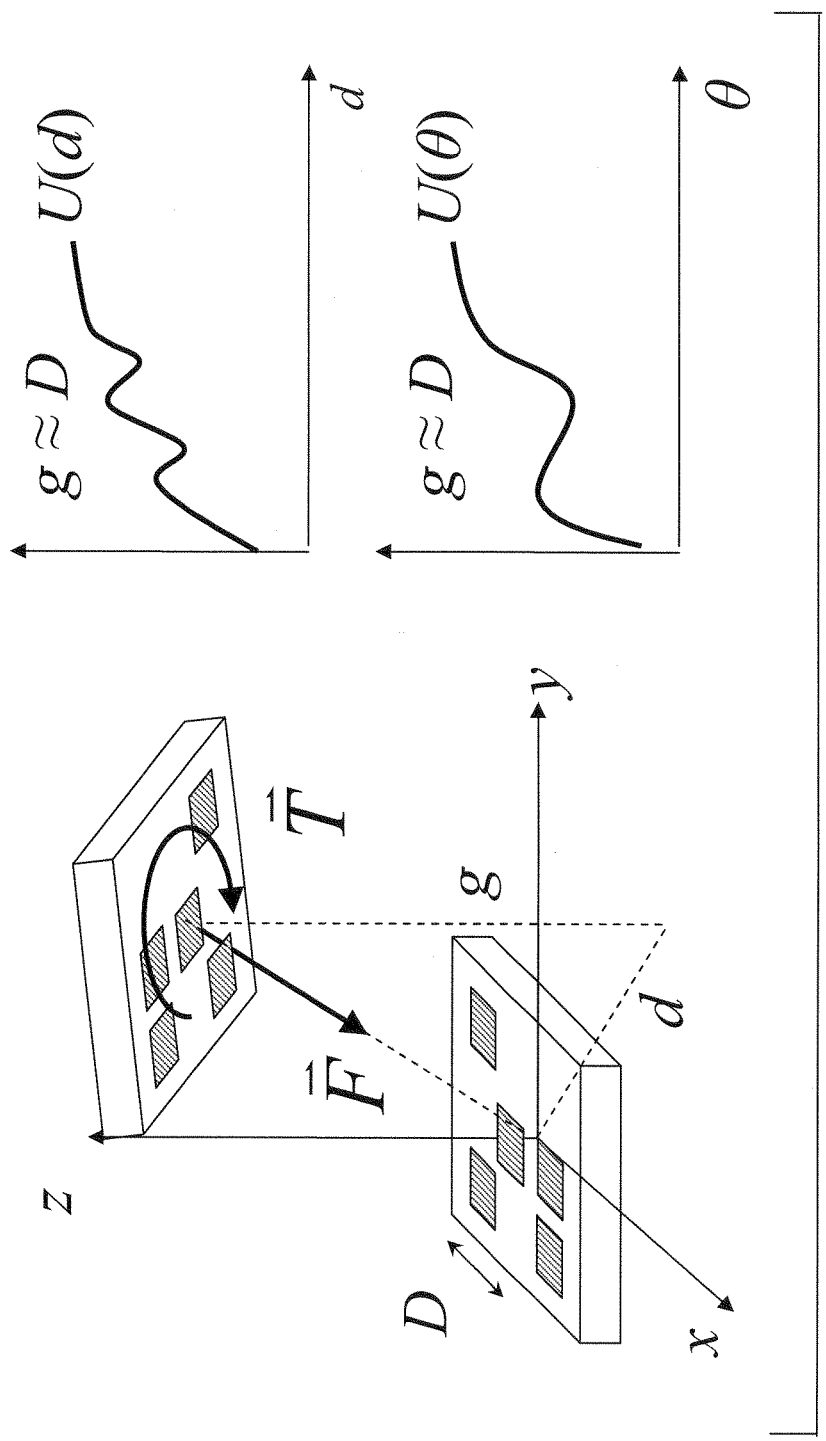
FIG. 24 is a schematic and graphical representation of the magnetic forces at work in accordance with the invention.

Reference is now made to FIGS. 23 and 24 for illustrating how the inherent properties of the individual magnets in the array will aid the self-sorting process. As shown in FIG. 23, two uniformly magnetized magnets are separated axially by a gap g and a lateral displacement, d. Under quasi-static conditions, the magnetic force, $\vec{F}$, between the two magnets can be computed using several approaches: Maxwell's stress tensor, energetic principles (method of virtual work), or equivalent source models. For all but the simplest geometries, finite-element methods are typical employed and for finite-element modeling, the method of virtual work has been shown to be the most precise.

In this approach, the magnetic force is calculated by the derivative of the magnetic energy, U, with respect to a virtual displacement, ds:

$$\vec{F} = \frac{\partial U}{\partial s} s \qquad (1)$$

The energy is related to the magnetic field distribution $\vec{B}$ by, $$U = \frac{1}{2\mu_0} \int_v |\vec{B}|^2 dV, \qquad (2)$$

where V is the volume, $\mu_0$ is the magnetic permeability of free space. From Eq. (1), it is clear the force acts in a direction so as to reduce the energy stored in the magnetic field. As shown in FIG. 23, the force acts to close the magnetic gap and can be decomposed into an axial pull-in force, $F_g$, and a radial alignment force, $F_d$, both functions of the gap, g, and displacement, d.

Magnetic pattern-matching is possible by combining the interactions of multiple magnets, as depicted in FIG. 24. Here, a plot of potential energy of the system versus lateral displacement, d, exhibits several local minima, as individual magnets align, but only one global minimum, where all the magnets align. Physically, as the arrays shift with respect to each other, overlap of individual magnets may cause small bonding forces. However, the peak bonding force for the system is not reached until all magnets are acting in parallel. This same effect would apply for rotational misalignment, denoted θ, and therefore could be used to realize orientational uniqueness.

This concept can also be extended to achieve bonding selectivity by considering the potential energy between different magnetic patterns. As dissimilar patterns overlap, individual magnets may cause small bonding forces, the parts will continue to mix until a part with the correct pattern fills the vacancy, thereby minimizing the total free energy. Again, by setting the mixing force higher than any attraction other than that provided by full alignment, the correct orientation will be self-selecting. In an embodiment, if magnets within the pattern are of different polarity, the patterns could cause repulsion between two bodies unless orientation between the patterns was correct so that all magnets attracted all opposed magnets.

Referring back to FIG. 21, during use, a first body such as circuit board 32, is provided with at least one predetermined pattern 44 of a plurality of magnets 42. A desired matching body, such as flip chip 34, is provided with a pattern 54 of a plurality of magnets 50. Magnets 50 are the opposite in polarity of magnets 42, although all of magnets 50 need not be the same polarity. Magnets 50 and/or magnets 42 are hard magnets. However, either one of magnets 50 or 42 may be hard magnets, while the other is a soft magnet. Member 32 and member 34 are mixed with each other. Because of the complementary magnetic patterns, when the magnetic attraction between member 34 and member 32 is sufficient to overcome the mixing forces, member 34, the flip chip, will be affixed to member 32 on the circuit board in the desired orientation so that solder bumps 52 are aligned with solder bumps 40. Because of the need for the magnetic attraction to overcome the mixing force, all non-aligned patterns will be dislodged or repulsed. For this reason, pattern 48 would not sufficiently attract pattern 54 because the overlay of magnets 50 with magnets 46 would not provide sufficient one-to-one correlation to overcome the mixing forces.

Similarly, second member 36 thrown into the same mixing process would, in parallel, become attracted to circuit board 32 because of the complementary magnetic patterns mirror image magnet patterns 48, 60. In this way, capacitor 36 and flip chip 34 are self-selecting for their appropriate position relative to circuit board 32. The same would be true if circuit board 32 were in fact broken into two pieces so that one half of circuit board 32 would be self-selecting with flip chip 34 while the other half would be self-selecting with capacitor 36 to prevent misfit or disorientation.

Figure 22A:
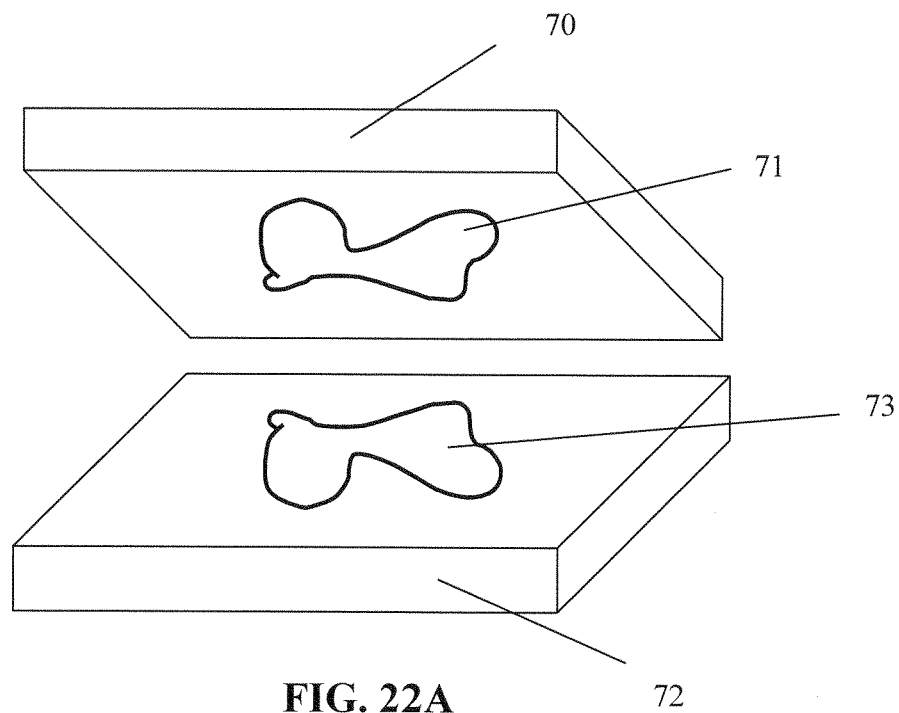
FIG. 22A is an exploded perspective view of a self-assembled circuit constructed in accordance with the invention.
Figure 22B:
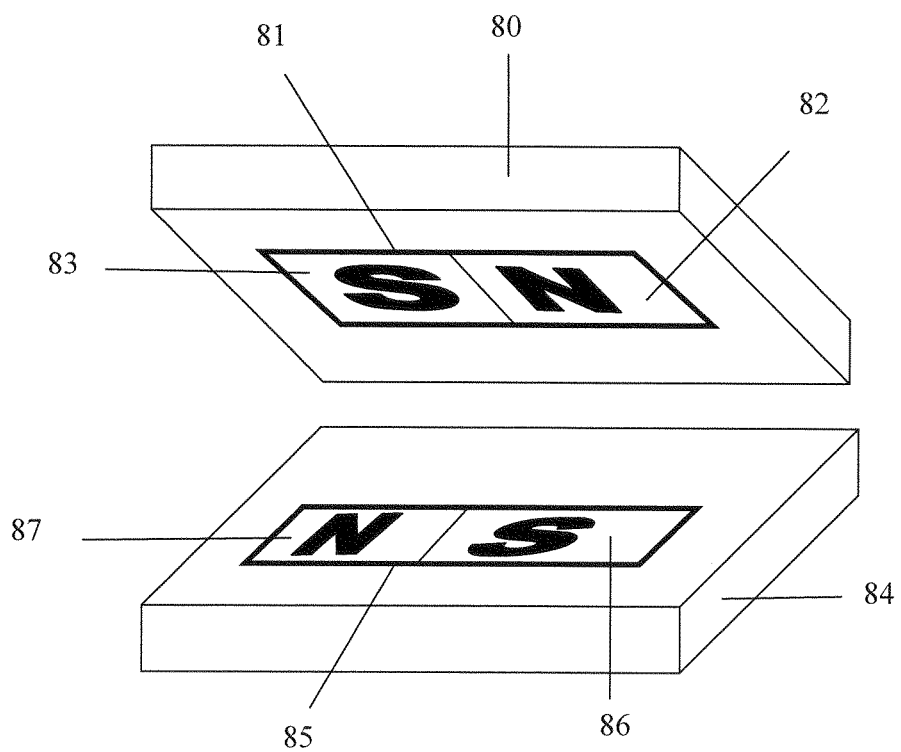
FIG. 22B is an exploded perspective view of a self-assembled circuit constructed in accordance with the invention.

The above examples were described in connection with patterns of a plurality of magnets. However, a patterned magnetic field is needed. Therefore, it is within the scope of the invention to provide a patterned magnetic field from a single magnet having a unique physical shape attracting a second single magnet of mirrored unique physical shape. FIG. 4A illustrates such an embodiment. For example, as shown in FIG. 22A, a first part 70 having a single magnet 71 with a unique shape can attract a second part 72 having a single magnet 73 of mirrored unique physical shape. A third manner to obtain the patterned magnetic field is to provide a single physical magnet with varying magnetic properties (magnetization pattern) within itself in the desired pattern. FIG. 22B illustrates such an embodiment. For example, as shown in FIG. 22B, a first part 80 can have a single physical magnet 81, for example in a stripe shape with a north polarized region 82 and a south polarized region 83 within the stripe shaped single magnet 81. A second part 84 can have a single physical magnet 85 with a south polarized region 86 and a north polarized region 87. In various embodiments, various combinations of permanent magnets, soft magnets, magnet arrays, magnet shapes, magnet magnetization profiles, and magnet patterns can be used to achieve a desired magnetic field pattern.

It is preferable for the magnetic materials to be integrated into the component structures. The magnetic structures are relatively small in volume as compared to the bodies in which they reside and therefore large amounts are not required reducing the relative cost.

For many microscale magnetic devices, relatively voluminous permanent magnets are needed in order to provide strong magnetic fields over large air gaps. Often, conventional bulk magnets are integrated with micromachined structures, but it is difficult, if at all possible, with conventional magnet manufacturing methods to achieve dimensions less than a few hundred microns. In contrast, microfabrication approaches, such as electrodeposition, sputtering, and pulsed-laser deposition, have been developed for depositing various magnetic films, but these methods are usually limited to film thicknesses of a few microns because of relatively slow deposition rates and stresses that can lead to cracking or delamination.

The magnetic processing according to embodiments of the present invention, as will be described below, can be performed in batch operations. For wafer-level processing, micromagnetic components can be integrated at pattern by electrodeposition as seen in FIG. 25A through 25E.

Figure 25A:
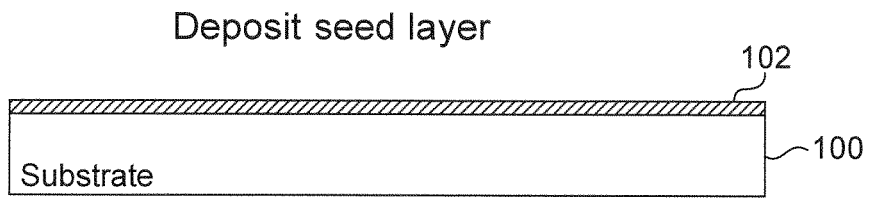
FIGS. 25A-25E show a schematic representation of the fabrication of wafers in accordance with the invention.
Figure 25B:
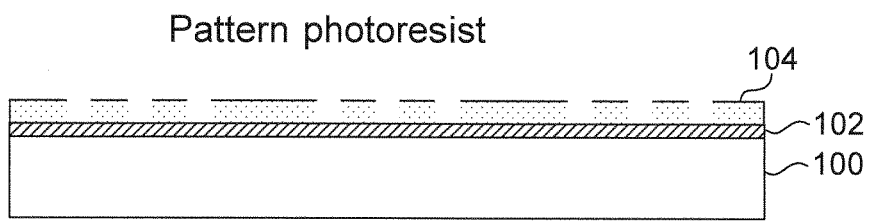
Figure 25C:
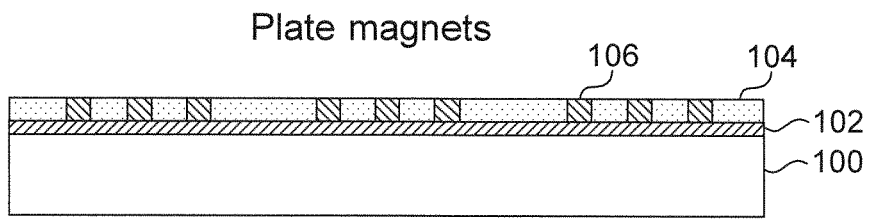
Figure 25D:
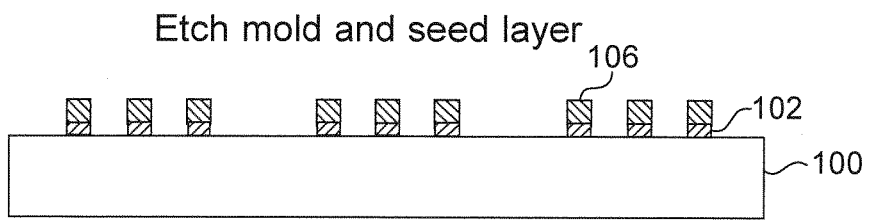
Figure 25E:
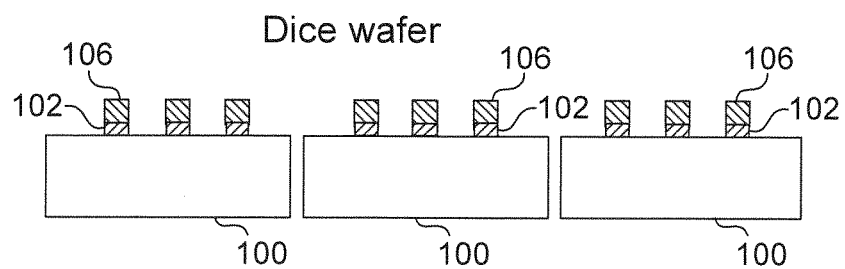

In the electrodeposition approach, the micro-magnets are patterned generally through photolithography. A substrate 100 as shown in FIG. 25A with a deposited seed layer 102. This conductive seed layer 102 is a thin layer of 0.1 μm. In FIG. 25B, small geometric shapes, having a height in the micrometer to millimeter range, are patterned into a photoresist layer 104, serving as the electroplating mold. In FIG. 25C, magnetic materials 106 are electroplated into the mold formed by photoresist layer 104. In FIG. 25D, the mold and seed layer 102 are removed by wet etching as known in the art. In FIG. 25E, the wafer is diced as known in the art. In one embodiment, a thin film of cobalt platinum can be electroplated into the mold.

This process is simple, low cost and CMOS compatible and is efficient for integrating a variety of magnetic materials with sufficient thickness (1 μm to 100 μm+) to provide useful magnetic fields. Many different thick film electroplated permanent magnet materials have been developed for MEMS applications possessing a wide range of magnetic strengths, which would lend themselves to the process.

Figure 26A:
FIGS. 26A-26F show a schematic representation of the fabrication of wafers in accordance with an embodiment of the present invention.
Figure 26B:
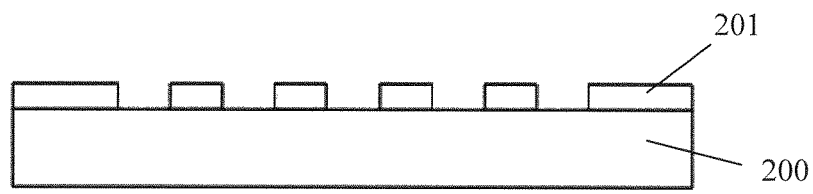
Figure 26C:
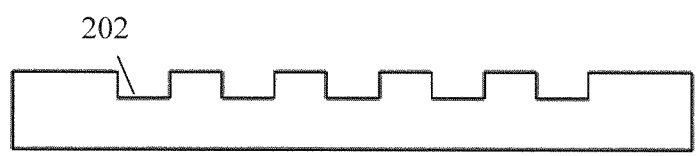
Figure 26D:
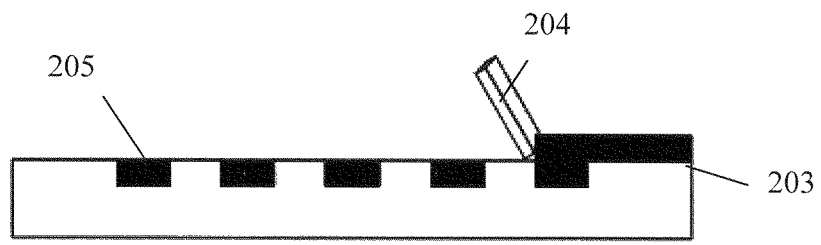

According to another embodiment of the present invention, micromagnetic structures can be embedded in a substrate as seen in FIGS. 26A-26F. In specific embodiments, micromagnetic structures embedded in a substrate can have thicknesses of at least 100 μm, at least 200 μm, or at least 400 μm, in order to provide sufficient magnetic strength for a given application. Referring to FIG. 26A, a silicon substrate 200 can be provided. The substrate 200 can include circuits or structures on certain regions, or can be later provided with circuits or structures after forming the embedded magnets. In specific embodiments, fabrication of embedded micromagnetic structures begins with patterning a photoresist 201 on the substrate 200. Referring to FIG. 26C, a deep reactive ion etch can be performed using the patterned photoresist 201 to pattern embedded trenches 202 into the wafer's surface. In a specific embodiment, the trenches 202 can be etched to a depth of about 10 μm to a depth of about 500 μm. Then, the patterned photoresist 201 can be removed. In one embodiment, the photoresist can be removed by rinsing the wafer 200 with acetone, methanol, and de-ionized water. Referring to FIG. 26D, the trenches 202 are packed with magnetic powder 203. According to embodiments of the present invention, the trenches can be packed with magnetic powder without the use of a polymer or resin carrier. In a specific embodiment, the magnetic powder is samarium cobalt (SmCo). According to an embodiment, SmCo powder can be poured onto the wafer's surface. Then, the powder 203 can be packed into the trenches 202 with compression by wiping a flat edge 204 across the wafer 200 leaving only SmCo powder in the trenches (see reference 205). Residual powder particles can be removed with, for example, a nitrogen gun or a cleanroom wipe.

Figure 26E:
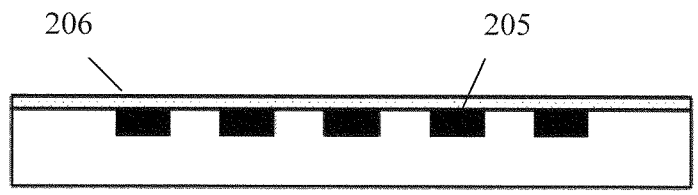
Figure 26F:

Referring to FIG. 26E, the packed powder 205 can be capped with a polyimide 206. The polyimide coating can be used to inhibit oxidation and to keep the powder within the trenches. In one embodiment, adhesion promoter can be spun over the surface of the wafer at 2000 rpm for 30 seconds and then baked at 95° C. for 3 minutes. Then polyimide can be spun onto the wafer at 2000 rpm for 1 minute and then baked at 150° C., ramping up to 300° C. at a ramp rate of 15° C. per minute. Upon reaching 350° C., the temperature can be held for another 3 minutes before removing the wafer from the hotplate.

After microfabrication, the wafers can be placed in a pulse magnetizer and magnetized in a preferential direction using a pulsed magnetic field of about 3 T.

In another embodiment, wax-bonded micromagnets can be fabricated for use in magnetic self-assembly of millimeter scale components. In a specific embodiment, wax powder particles are introduced as a binder agent for dry packing neodymium iron boron (NdFeB) powder in preetched trenches. According to one embodiment, a small amount of wax powder, such as 2.00-6.75 wt %, can effectively lock the magnetic powder within the trench to form micromagnets. In an example, the rare earth NbFeB magnetic powder includes particles having ball shapes, distributed size, and an average diameter of about 50 μm. The binder wax may be a wax having a melting temperature of 80° C. According to one embodiment, the wax can be crushed to a coarse powder, followed by 24 hours of ball milling to obtain fine particles. The wax powder may have an average diameter of about 5 μm using such a process.

According to an example showing effects of different wax powder loadings within the powder packed into the trenches, the magnetic powder was homogeneously mixed with various wax powder loading fractions from 2 to 15 wt %. The mixture was dry packed at room temperature into preetched rectangular cavities (500×500 μm² laterally; 320 μm deep) in a silicon wafer with compression by wiping a flat edge across the wafer, leaving only powder in the trenches. After packing, the whole silicon wafer was heated in an oven at 90° C. for 2 min and then cooled down in air, allowing the wax to melt and bond the magnetic particles. Finally, the wafer surface was cleaned by de-ionized water and blown dry with nitrogen. For characterization, the wafer was placed in a pulse magnetizer and magnetized in the in-plane direction using a pulsed magnetic field of ~3 T.

Figure 27:
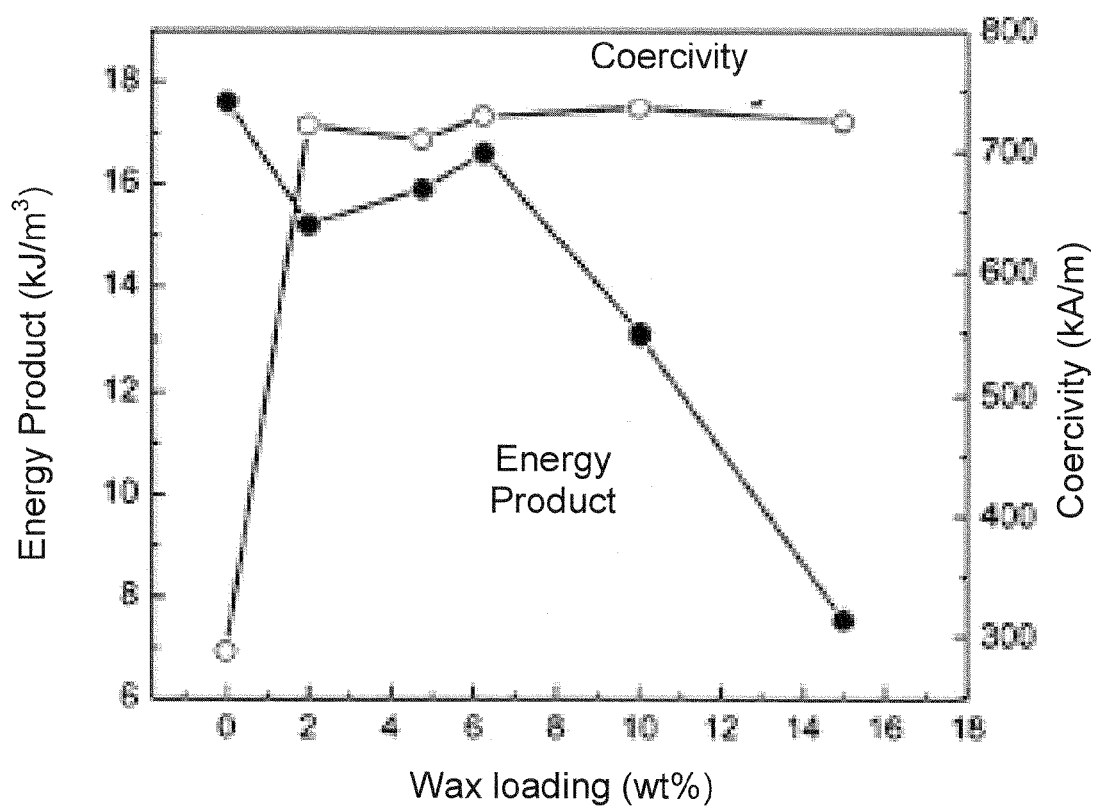
FIG. 27 shows a plot of energy products and coercivities of wax-bonded micromagnets as a function of wax weight percentage in accordance with an embodiment of the present invention.

FIG. 27 shows the energy product and coercivity as a function of the wax weight percentage. The data show an optimum wax loading condition at 6.25%. Below this value, the motion of unbonded particles appears to cause a decrease in the energy product, while above this value, the dilution of the magnetic moment by the binder wax also appears to decrease the energy product. These two mechanisms compete with each other to yield an optimum point. In addition, the results indicate that the coercivity is substantially improved when a small amount of wax is introduced, and fairly constant for all weight fractions tested. In the described experiment, the micromagnet coercivity improves over the raw dry-packed powder from 287 kA/m to 737 kA/m. This approach can be applied to other magnetic powders in accordance with embodiments of the present invention. The smallest magnet dimension may be limited by the powder size. Although the wax used in the above described study may not integrate easily into wafer-scale fabrication processes because of the wax's melting point of 80° C., other waxes or similar bonding agents with higher melting points may be used in its place.

Other methods exist in the art for patterning small magnetic patterns onto micro-fabricated parts, such as sputtering, pulsed-laser deposition, and evaporation. For non-micro-fabricated parts, screen printing particle could be used. Also, new liquid metal jet printing methods, similar to inkjet printing, may be used to deposit small molten droplets of metallic alloys in pattern arrays. Lastly, magnetic materials may be diffused in a pattern into a substrate or body. As a result of providing a predetermined magnetic pattern and a complementary magnetic pattern thereof on two respective bodies, it is possible to self-assemble small free floating bodies on a large parallel basis. By providing specific magnet patterns, the bodies will be self-selecting and self-orienting to each other so that only the correct bodies in the correct orientations will bond in a mixing process, whether wet or dry.

In a specific embodiment, the first magnetic field on the first body can be n-fold symmetric and the second magnetic field on the second body can be n-fold symmetric such that there are n orientations that the second body can be fully aligned and bonded with the first body. In other embodiments, the complementary first and second magnetic fields are asymmetric such that only one orientation of the first and second bodies results in full alignment and bonding.

In a specific embodiment, a structure can have additional bodies that can align and bond to the second body, or any other body of the structure, due to magnetic fields on the additional bodies and the bodies to which the additional bodies align and bond. As an example, a robot structure can have a torso that aligns and bonds with a right arm, a left arm, a right leg, a left leg, and a head. Each of the parts, or bodies, can selectively bond to the torso such that each part bonds only to the appropriate location and not to other locations. In a further embodiment, a right hand, a left hand, a right foot, and a left foot, can align and bond with the right arm, the left arm, the right leg, and the left leg, respectively. The alignment and the bonding can be done in stages or simultaneously. In this way, a plurality of torso and a corresponding plurality of associated parts could be mixed such that the robots are self-assembled. In an analogous way, other structures, such as MEMS structures, could be assembled. Such structures could include a variety of parts to be assembled, such as gears, blocks, levers, and other structures that can be held together via magnets incorporated with the parts.

In an embodiment, the first body and second body that will be in contact after alignment and bonding can incorporate other attachment and/or connectivity means, such as glues for mechanical adhesion and solder bumps for electrical connectivity or bonding. In an embodiment, solder bumps can be used such that heating after alignment and bonding can cause a portion of the first body to be soldered to a portion of the second body. In another embodiment, glue can be used such that heating after alignment and bonding can cause a portion of the first body to be glued to a portion of the second body.

In a specific embodiment, shielding material can be incorporated with the first and/or second body to shield the magnetic fields of the first and/or second body from portions of the aligned and bonded structure or other objects proximate to the structure. Such shielding materials are well known in the art. As an example, soft magnetic materials can be used as shielding. A layer of soft magnetic material can be placed on one or more bodies and then the magnets for the body grown on the soft magnetic material layer such that the portion of the body below the layer is shielded from the magnetic fields of the magnets grown on the layer.

In a specific embodiment, demagnetizable magnets and/or magnetic materials can be used such that after alignment and bonding, and optional implementation of additional attachment means, the demagnetizable magnets and/or magnetic material can be demagnetized. In an example, magnets and/or magnetic material that can be demagnetized by heating can be used. Such materials are well known in the art. In a specific embodiment, magnets and/or magnetic materials that can be demagnetized by heating to demagnetization temperatures under 500° C. can be used.

Preferably, the magnetic attraction force between two bodies are at least as great as the weight force of the body free to move, and at least as great as the weight force of the lightest body if both bodies are free to move. Preferably, the magnetic attraction force is two to ten as great as the weight force of the body free to move, and at least two to ten as great as the weight force of the lightest body if both bodies are free to move.

Embodiments of the present invention can provide magnetic self assembly of mm-scale components. According to one embodiment example, a 500 μm thick silicon wafer is patterned with squares using a positive tone photoresist. Subsequently, 60 μm deep trenches are etched using deep reactive ion etching. SmCo powder, having an average particle size of 5 μm to 10 μm is packed into these trenches. To inhibit spilling of the powder, a ~5 μm layer of polyimide is then spun and cured on top. The individual parts for this example are created by dicing the wafer into chips of size 1 mm². The fabricated square shaped magnets are either 500 μm×500 μm×60 μm or 850 μm×850 μm×60 μm, covering approximately 25% and 75%, respectively, of the 1 mm² part surface area. Substrates with a 4×4 array of receptor sites are created using the same fabrication process.

Different magnetic patterns such as squares, stripes, and ovals with 2-fold and 4-fold rotational symmetry fabricated can be utilized according to an embodiment of the present invention. The magnets can be batch-fabricated at the wafer level using a packed trench fabrication process as described above. For example, 100 mm diameter, 500 μm thick Si wafers can be etched to form small cavities and then packed with SmCo magnetic powder. A thin layer of polyimide can be spun on the wafer to lock the powder in place. After magnetization of the magnets using an external field, the wafer can be diced into individual components.

Self-assembly occurs when the embedded magnets with opposite polarity bond to one another, resulting in an energy minima. Intermagnetic forces and torques compel the components to rotate and align. The square magnetic patterns exhibit 4-fold rotational symmetry resulting in four possible bonding orientations, while stripe and oval patterns can exhibit 2-fold symmetry permitting assembly in only two orientations. Symmetry appears to increase the probability for bonding and thus appears to increase assembly speed and yield.

Example 1

Multifunctional Self-Assembly of Millimeter Scale Components

The self-assembly of the components in this example use magnetic forces between permanent micromagnets integrated on the component surfaces. Part-to-part assembly is demonstrated by batch assembly of free-floating 1 mm×1 mm×0.5 mm silicon parts in a liquid environment with the assembly yield varying from 88% to 90%. Part-to-substrate assembly is demonstrated by assembling an ordered array on a substrate in a dry environment with the assembly yield varying from 87% to 98%. In both cases, diverse magnetic shapes/patterns are used to control the alignment and angular orientation of the components and assembly times range from 15-240 s.

In this example, part-to-part MSA in a liquid environment and part-to-substrate assembly in dry environment, both with angular orientation are accomplished. Different magnetic patterns such as squares, stripes, ovals, triangles, and arrowheads are explored, covering 4-75% of the bonding surface area. Analytical and finite element methods are used to estimate the bonding forces.

Figure 1:
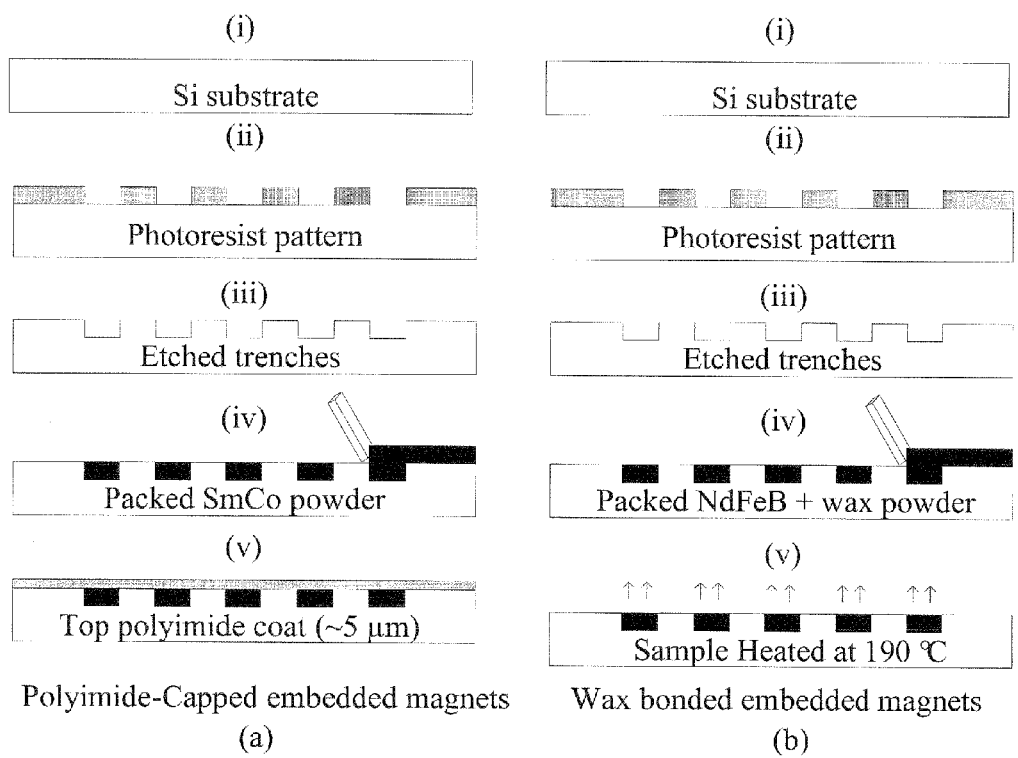
FIG. 1 shows a fabrication processes for embedding magnets in a substrate, in accordance with an embodiment of the subject invention.

The components used for this study are 1 mm×1 mm×0.5 mm silicon blocks with micromagnets integrated on the bonding surface. As shown in FIG. 1, the magnets are batch-fabricated at the wafer level using two different previously developed magnetic powder processes (B. Bowers, et al., "A method to form bonded micromagnets embedded in silicon," in *Proc. 14th Int. Conf. Solid-State Sensors, Actuators, and Microsystems (Transducers 07)*, 2007, pp. 1581-1584; N. Wang, et al., "Wax-bonded NdFeB micromagnets for microelectromechanical systems applications," *J. Appl. Phys.*, vol. 103, pp. 07E109-1-3, 2008.). Starting with 100 mm diameter, 500 μm thick Si wafers, small cavities are etched in the silicon. For the polyimide-capped magnets, the cavities are then packed with magnetic powder, and a thin layer of polyimide is spun and cured on the wafer to lock the powder in place. For the wax bonded magnets, instead of using the polyimide cap, a wax powder is used to bond the magnetic powder in the trenches.

For this example, polyimide capping was used for SmCo magnets, while wax bonding was used for NdFeB and ferrite magnets. Typical properties of the fabricated magnets measured using a vibrating sample magnetometer (VSM) are shown in Table 1, showing the NdFeB magnets posses the highest magnetic properties. Additionally, the magnets (SmCo only) used for the part-to-part assembly are 60 μm thick, and the magnets (SmCo, NdFeB, and ferrite) used for the part-to-substrate assembly are 150 μm thick.

Figure 2:
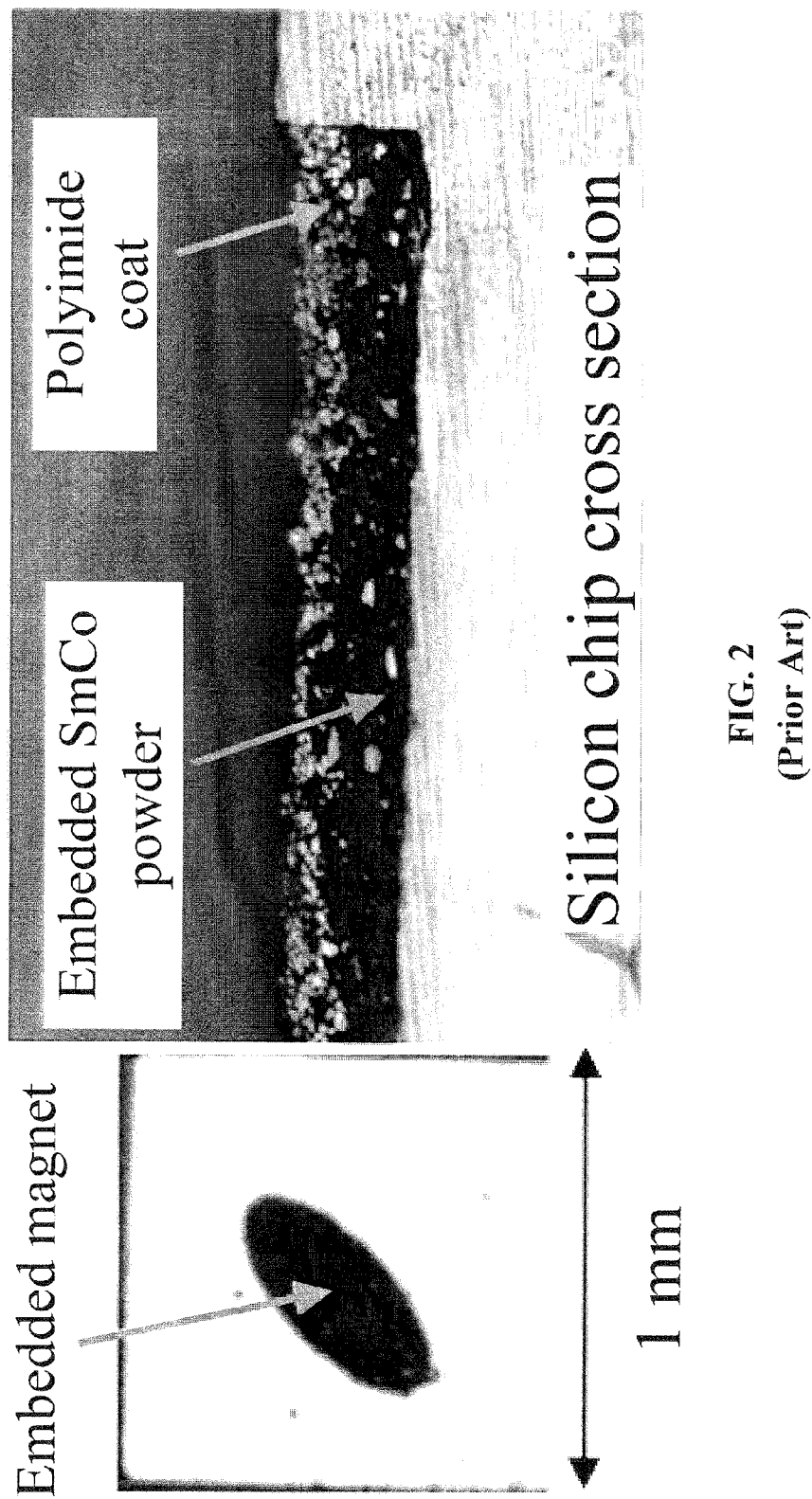
FIG. 2 shows a top view and cross-section of a component with embedded polyimide-capped SmCo magnet in accordance with an embodiment of the subject invention.

After pulse magnetization to pole the magnets, the wafer is diced into 1 mm×1 mm individual components. FIG. 2 shows a top view and cross-section of a single component with polyimide-capped embedded magnet. A similar process is used for fabrication of substrates for the part-to-substrate assembly. The substrates possess a 5×5 array of "receptor sites" with center-to-center spacing of 1.4 mm

TABLE 1

Magnetic properties of embedded micromagnets.

| Material (size) | Fabrication Method | $H_c$ (kA/m) | $B_r$ (T) | $BH_{max}$ (kJ/m³) |
|---|---|---|---|---|
| SmCo (10 μm) | Polyimide-capped | 103 | 0.11 | 1.25 |
| NdFeB (50 μm) | Wax-bonded | 727.2 | 0.36 | 21.5 |
| Ferrite (2 μm) | Wax-bonded | 312.8 | 0.1 | 1.7 |

The experimental setup for part-to-part self-assembly is shown in FIG. 3. For each set of experiments, eight components to be assembled are magnetized with one polarity, and an excess of components (~32) are magnetized with opposite polarity. The parts are mixed together in a rotating conical tube with approximately 1 ml of methanol. The methanol allows the components to randomly mix and tumble over each other. It also prevents the components from sticking to the tube surface and mitigates air bubble formation. The tube is inclined at an angle of 35°-45° and rotated at ~60 rpm. Because of the magnetization direction, like parts do not bond with each other since they have the same polarity (like poles repel), thus avoiding agglomeration.

Figure 4:
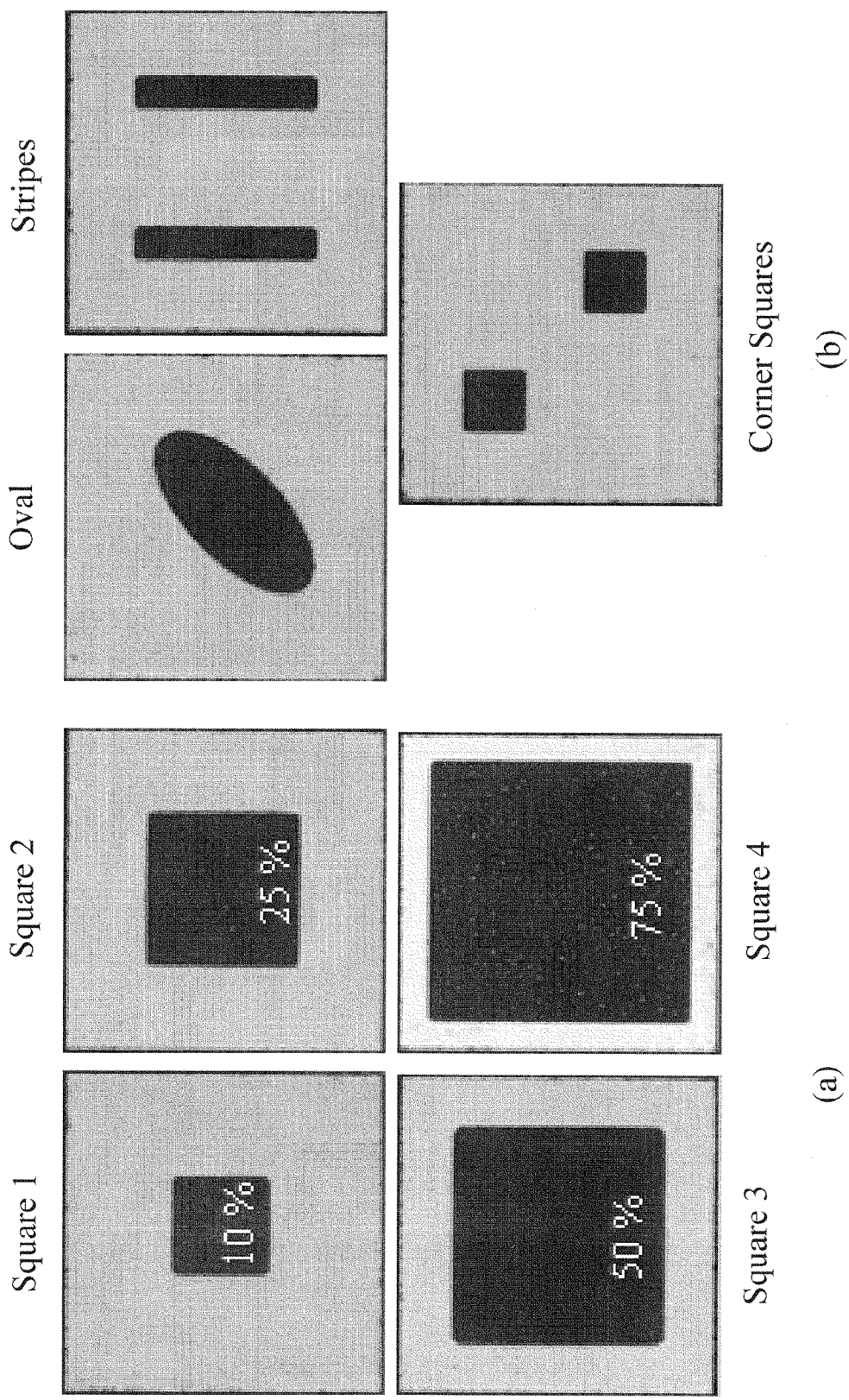
FIGS. 4a and 4b show various magnetic patterns used for magnetic self-assembly, where the patterns in FIG. 4a have 4-fold symmetric and the patterns in FIG. 4b have 2-fold symmetric patterns.

60 μm-thick polyimide-capped SmCo magnets are used to demonstrate the part-to-part self-assembly process. FIG. 4 shows the various magnetic patterns used. The square magnetic patterns exhibit 4-fold rotational symmetry resulting in four possible bonding orientations; the corner squares, stripe, and oval patterns exhibit 2-fold symmetry permitting assembly in only two orientations.

The number of component pairs assembled after 20 s is recorded. Table 2 and Table 3 summarize the results for the magnetic patterns with 4-fold and 2-fold symmetry respectively. The percentage yields are averaged over 15 runs and values presented are with the 95% confidence intervals. The percentage yield for the components with 4-fold symmetry varies from 89% to 97%. The results in Table 2 show an increase in yield with decreasing bonding force and surface area. This is because of excessive bonding forces that cause multiple components to stick to one another in an uncontrollable manner, observed predominantly in the Square 4 case where the estimated bond force was 0.2 mN. The yield for the components with 2-fold symmetry varies from 88% to 90%, slightly lower than the 4-fold case. One general trend found for the part-to-part experiments is that better yields are achieved with smaller forces.

TABLE 2

Part-to-part magnetic self-assembly results for magnetic patterns with 4-fold symmetry.

| Component Type | Magnet Area | Force (FEM) | % Yield (20 s) |
|---|---|---|---|
| Square 1 | 10% | 0.08 mN | 97 ± 2.6 |
| Square 2 | 25% | 0.12 mN | 97 ± 2.4 |
| Square 3 | 50% | 0.17 mN | 93 ± 4.2 |
| Square 4 | 75% | 0.20 mN | 89 ± 4.3 |

TABLE 3

Part-to-part magnetic self-assembly results for magnetic patterns with 2-fold symmetry.

| Component Type | Magnet Area | Force (FEM) | % Yield (20 s) |
|---|---|---|---|
| Oval | 16% | 0.05 mN | 90 ± 4.4 |
| Stripes | 12% | 0.17 mN | 89 ± 4.8 |
| Corner squares | 10% | 0.10 mN | 88 ± 4.2 |

Part-to-substrate assembly is demonstrated by batch assembly of components into an ordered array on a planar substrate. The substrate used is a 5×5 array of receptor sites, and ~6× redundant parts (150) are used for the example. As shown in FIG. 5, the experimental setup allows the components to be agitated using an electromechanical shaker and assembled onto an inverted substrate. A 3 Hz, 2 $V_{p-p}$, square wave is fed from a signal generator through an amplifier to the shaker in order to bounce the components ~10 mm. The substrate is attached to a rod that is connected to a vibrating piezoelectric plate. The piezoelectric plate provides a secondary vibration that helps align the components and prevent the stacking of components (an extra component sticking to the back of the assembled component). The frequency and amplitude of the piezo vibrator are tuned by trial and error, but depend on the force between the magnets on the components being assembled. A digital camera is used to capture and record the data into a computer for image processing.

Figure 6:
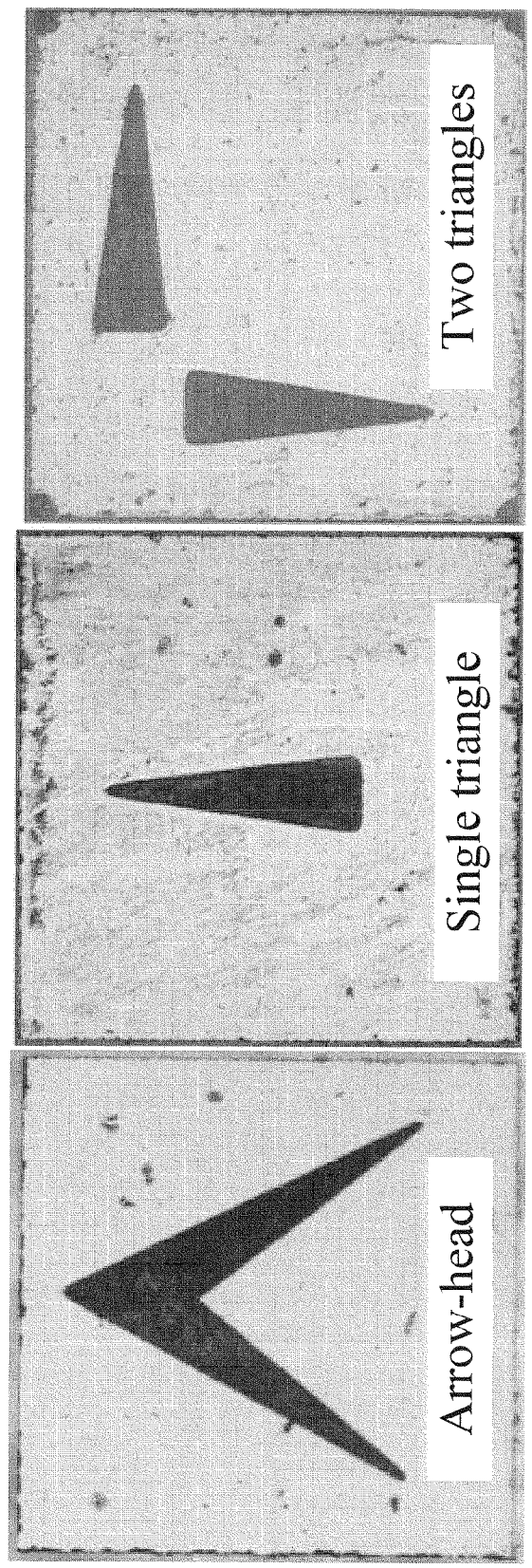
FIG. 6 shows components having asymmetric magnetic patterns for magnetic self-assembly with orientation uniqueness, in accordance with an embodiment of the subject invention.
Figure 7:
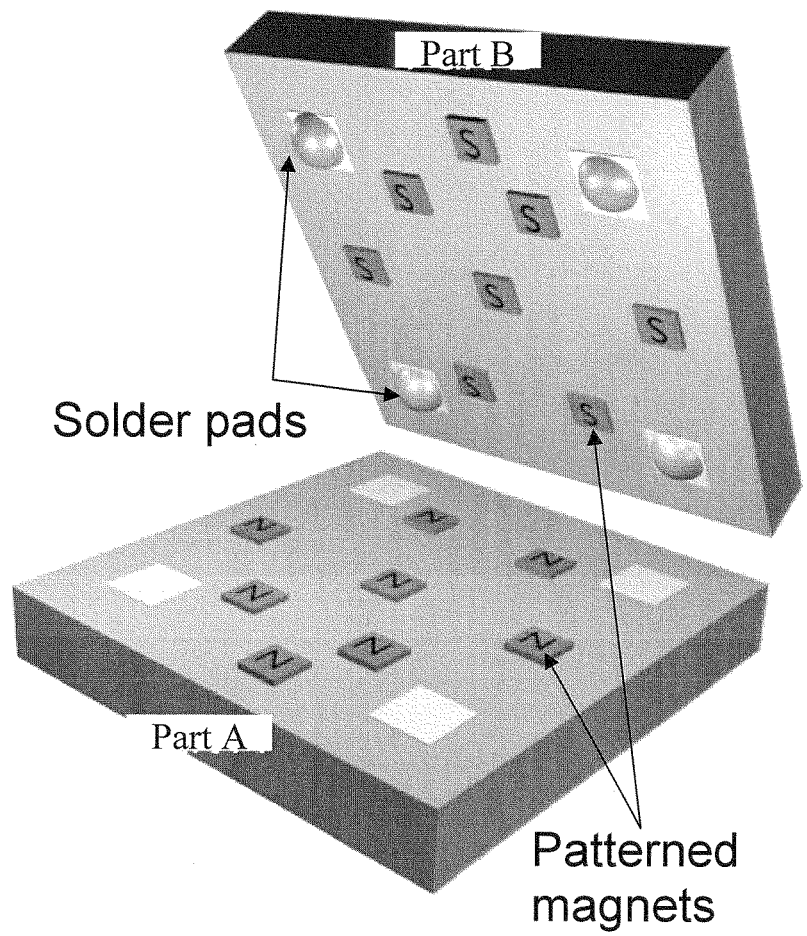
FIG. 7 shows two complementary parts having complementary magnetic field patterns and complementary electrical interconnections, in according with embodiments of the subject invention.
Figure 8:
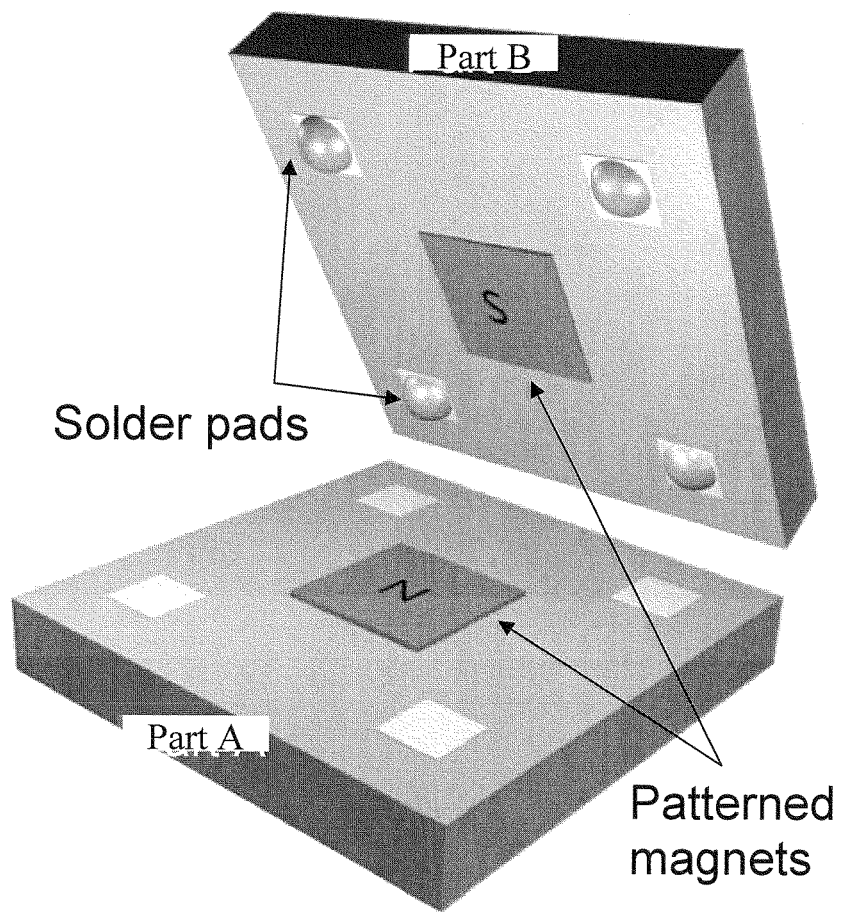
FIG. 8 shows two complementary parts having complementary magnetic field patterns and complementary electrical interconnections, where the parts have 4-fold symmetry, in according with embodiments of the subject invention.
Figure 9:
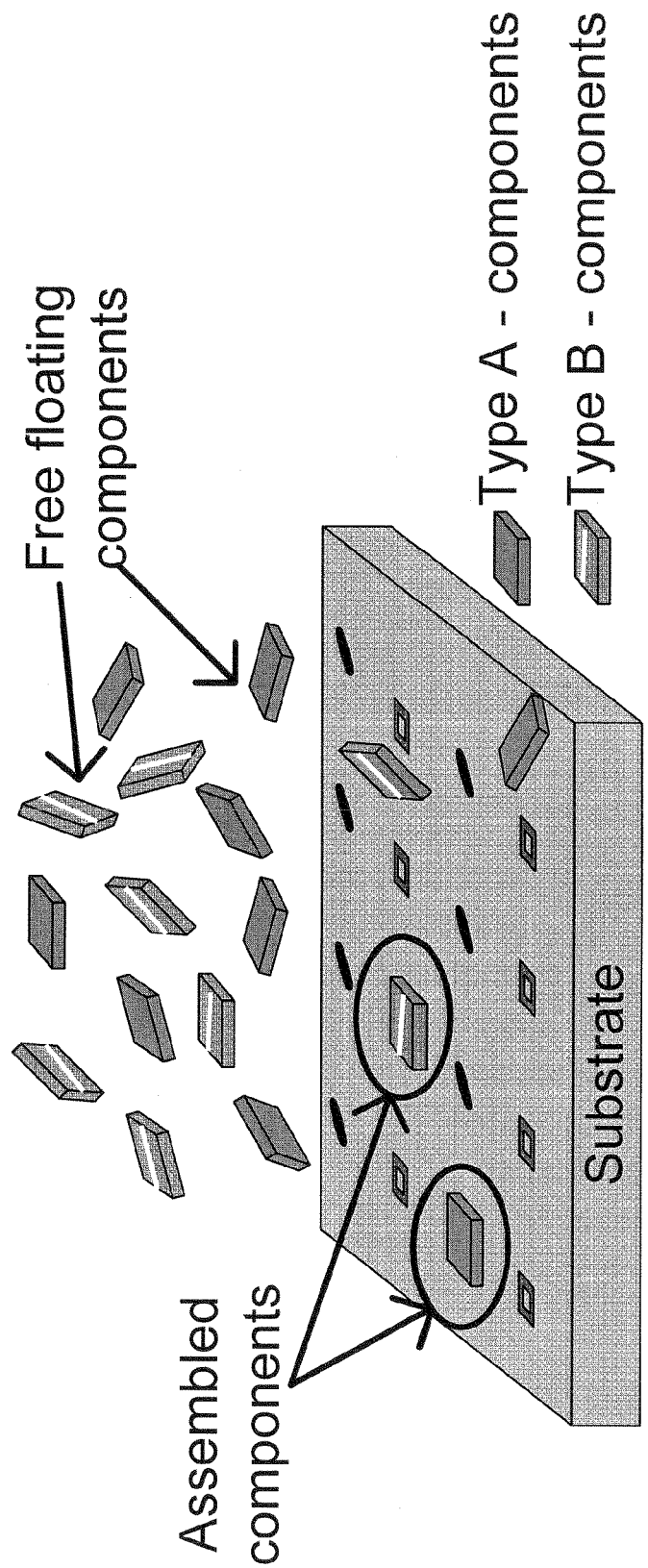
FIG. 9 shows a schematic substrate and a plurality of each of two types of components, where each of the two types of components has a complimentary magnetic field pattern to a corresponding bonding site on the substrate, where the substrate has two types of bonding sites that correspond to the two types of components.
Figure 10:
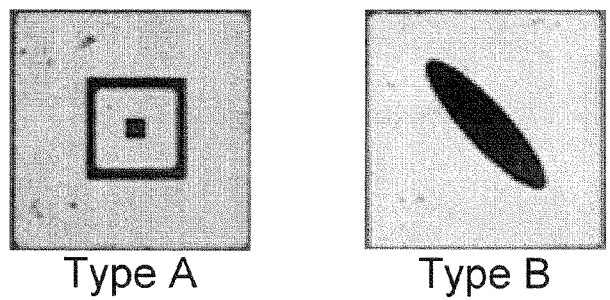
FIG. 10 shows two types of components consistent with the schematic of FIG. 9.
Figure 11:
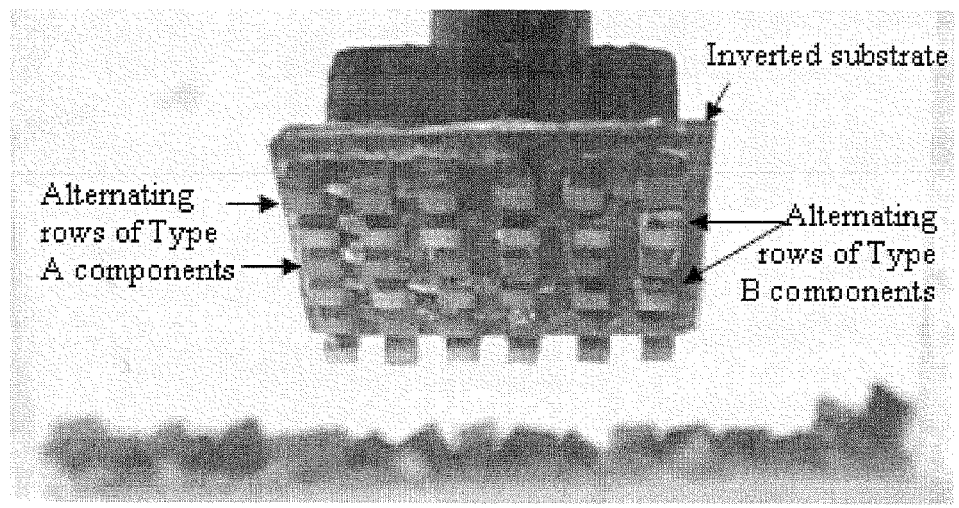
FIG. 11 shows a substrate consistent with the schematic of FIG. 9 having components shown in FIG. 10 magnetically bonded to the substrate after sequential magnetic self assembly.

In addition to the magnetic patterns shown in FIG. 4, three asymmetrical patterns shown in FIG. 6 are used for the part-to-substrate experiments. The arrow-head, single triangle, and two triangle patterns restrict assembly to only one physical orientation. The components are fabricated with either polyimide-capped SmCo magnets or wax-bonded NdFeB or ferrite magnets. The magnets cover about 4% to 75% of the component surface area and the thickness is about 150 μm.

Table 4 summarizes the results for the components with 4-fold, 2-fold and asymmetric patterns. The recorded percentage yield is averaged over 15 test runs and reported with 95% confidence intervals.

The first experiments examined the 4-fold symmetry cases using small ("Square 1") and large ("Square 4") square patterns with either SmCo or NdFeB. The percentage yield for 4-fold symmetry varies from 88% to 98%. For the "Square 1" case, higher yields and faster assembly rates were achieved with NdFeB, attributed to the higher bonding force as compared to the SmCo. Here we note that higher forces appear to increase yield, as compared to the part-to-part assembly where the opposite trend was observed. However, there is a limit. The "Square 4" components with NdFeB magnets caused stacking (a free component sticking onto the back of another component) due excessively strong bond forces, thus hindering the assembly process. This indicates there is an optimum for the magnetic force where yield is maximized.

Another observation is that high yields and fast assembly times can also be achieved with lower bonding forces if the magnet surface area is increased, as in the case of the SmCo "Square 4."

For the 2-fold symmetry experiments, to avoid stacking, different types of magnets were used for the substrate and components—the substrate being the stronger NdFeB, and the components being the weaker SmCo. The yield for the 2-fold symmetry experiments varies from

TABLE 4

Part-to-substrate magnetic self-assembly results.

| Component Type | Symmetry | Magnet Area | Substrate Magnets | Part Magnets | Force (FEM) | Time (s) | % Yield |
|---|---|---|---|---|---|---|---|
| Square 1 | 4-fold | 10% | SmCo | SmCo | 0.13 mN | 58 | 88.3 ± 2.0 |
| Square 1 | 4-fold | 10% | NdFeB | NdFeB | 2.2 mN | 33 | 97.6 ± 1.3 |
| Square 4 | 4-fold | 75% | SmCo | SmCo | 0.37 mN | 33 | 97.7 ± 1.1 |
| Square 4 | 4-fold | 75% | NdFeB | NdFeB | 6.6 mN | Stacking | |
| Oval | 2-fold | 16% | NdFeB | SmCo | 0.28 mN | 15 | 96.8 ± 2.1 |
| Stripes | 2-fold | 12% | NdFeB | SmCo | 0.86 mN | 22 | 94.7 ± 2.5 |
| Corner squares | 2-fold | 10% | NdFeB | SmCo | 0.54 mN | 33 | 85.6 ± 2.8 |
| Arrow-head | Asymmetric | 11% | NdFeB | Ferrite | 0.48 mN | 33 | 87.2 ± 2.8 |
| Single triangle | Asymmetric | 4.3% | NdFeB | Ferrite | 0.22 mN | 120 | 88.5 ± 3.2 |
| Two triangles | Asymmetric | 8.5% | NdFeB | Ferrite | 0.45 mN | 240 | 82.0 ± 6.5 |

85% to 97%. The oval magnet components assemble much faster with higher yield compared to the stripes and corner squares patterns, despite having the lowest FEM-predicted bonding force. The oval possessed the largest surface area, suggesting the assembly rate and yield improves with increasing magnet surface area.

For the experiments with asymmetric magnetic patterns, the substrate magnets are again the stronger NdFeB and the parts this time are ferrite. The ferrite magnets are chosen for the same reason as the SmCo magnets—that is for their weaker bonding force. The smaller physical diameter ferrite powder (~2 µm) also permits the fabrication of sharp magnet apexes, important for the asymmetric patterns. The yield in this case varies from 82% to 89%, the highest yields being for the arrow-head and single triangle patterns. The highest assembly rate is achieved for the arrow head pattern, which also has the highest surface area, again indicating that rate and yield correlate with surface area. However, the two triangle rate is less than the single triangle rate, even though the two triangle total magnet surface area is twice that of the single triangle. This suggests that higher rates can be achieved with higher surface area provided that the magnet surface area is continuous, i.e. a single magnet is better compared to multiple magnets.

Both magnetic self-assembly for part-to-part and part-to-substrate assembly with angular orientation were shown to produce reasonably high yields (up to 98%) with fast assembly times (15-240 s).

Part-to-part assembly was achieved using free-floating parts in a liquid environment using a tumbler apparatus. In the case of part-to-substrate assembly, controlled assembly of parts was achieved using a shaker setup in conjunction with active vibration of the substrate. The use of stronger magnets on the substrate and weaker magnets for the components mitigated stacking issues and permitted an additional level of process control.

The example showed that higher bonding forces are required for part-to-substrate assembly as compared to part-to-part assembly, presumably because stronger forces are necessary to capture the part during the more "dynamic" assembly part-to-substrate process. In both types of assemblies, the assembly rate and yield increases with the magnet symmetry. This indicates that symmetry, which increases the number of possible bonding orientations, directly increases the probability of a individual bonding event.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. A method for magnetically-directed self-assembling parts, comprising:
   providing at least one first body, each first body exhibiting a first magnetic field having a first predetermined pattern;
   providing at least one second body, each second body exhibiting a second magnetic field having a second predetermined pattern;
   mixing the at least one first body with the at least one second body with a mixing force, wherein during mixing the at least one first body with the at least one second body with the mixing force the at least one first body is free-floating, wherein one of the at least one first body and one of the at least one second body are fully aligned to each other and bonded together by a magnetic attraction force between the one of the at least one first body and the one of the at least one second body when a magnetic attraction force between the one of the least one first body and the one of the at least one second body is sufficient to overcome the mixing force; and
   removing one or more hard magnet and/or soft magnet from the one of the at least one first body after bonding with the one of the at least one second body.

2. The method according to claim 1, wherein removing the one or more hard magnet and/or soft magnet is accomplished via etching.

3. The method according to claim 1, wherein the at least one second body is bonded to a front side of the at least one first body, wherein the one or more hard magnet and/or soft magnet is positioned on a back side of the at least one first body.

4. The method according to claim 3, wherein removing the one or more hard magnet and/or soft magnet is accomplished via etching.

5. The method according to claim 3, wherein the one or more hard magnet and/or soft magnet is mechanically removed.

6. The method according to claim 3, wherein the one or more hard magnet and/or soft magnet is removed via chemical mechanical polishing.

7. The method according to claim 3, wherein the at least one first body comprises a silicon on insulation (SOI) wafer and a handle wafer, wherein the one or more hard magnet and/or soft magnet is removed by etching a buried oxide layer.

8. The method according to claim 1, wherein removing one or more hard magnet and/or soft magnet from one or more of the at least one first body comprises removing one or more hard magnet from the one or more of the at least one first body.

9. The method according to claim 1, wherein during mixing the at least one first body with the at least one second body with the mixing force the at least one second body is free-floating.

10. A method for magnetically-directed self-assembling parts, comprising:
    providing at least one first body, each first body exhibiting a first magnetic field having a first predetermined pattern, wherein the first magnetic field is at least in part created by a first assembly magnet and a first alignment magnet;
    providing at least one second body, each second body exhibiting a second magnetic field having a second predetermined pattern, wherein the second magnetic field is at least partially created by a second assembly magnet and a second alignment magnet, wherein magnetic attraction between the first assembly magnet and the second assembly magnet causes bonding between the one of the at least one first body and the one of the at least one second body, wherein after bonding between the one of the at least one first body and the one of the at least one second body, magnetic attraction between the first alignment magnet and the second alignment magnet tends to align the one of the at least one first body and the one of the at least one second body;
    mixing the at least one first body with the at least one second body with a mixing force, wherein one of the at least one first body and one of the at least one second body are bonded together by a magnetic attraction force between the one of the at least one first body and the one of the at least one second body when a magnetic attraction force between the one of the least one first body and the one of the at least one second body is sufficient to overcome the mixing force, wherein the magnetic attraction between the first assembly magnet and the second assembly magnet is sufficient to overcome the mixing force, wherein the magnetic attraction between the first assembly magnet and the second assembly magnet does not tend to align the one of the at least one first body and the one of the at least one second body.

11. The method according to claim 10, wherein the first assembly magnet is larger than the first alignment magnet and the second assembly magnet is larger than the second alignment magnet.

12. The method according to claim 10, wherein the first alignment magnet and the second alignment magnet provide angular alignment.

13. The method according to claim 10, wherein the first alignment magnet and the second alignment magnet provide lateral alignment.

14. The method according to claim 10,
    wherein after bonding between the one of the at least one first body and the one of the at least one second body, further comprising applying an external magnetic field, wherein applying the external magnetic field reduces the magnetic attraction force between the one of the at least one first body and the one of the at least one second body.

15. A method for magnetically-directed self-assembling parts, comprising:
    providing at least one first body, each first body exhibiting a first magnetic field having a first predetermined pattern;
    providing at least one second body, each second body exhibiting a second magnetic field having a second predetermined pattern;
    mixing the at least one first body with the at least one second body with a mixing force, wherein one of the at least one first body and one of the at least one second body are fully aligned to each other and bonded together by a magnetic attraction force between the first magnetic field of the one of the at least one first body and the second magnetic field of the one of the at least one second body when a magnetic attraction force between the first magnetic field of the one of the at least one first body and the second magnetic field of the one of the at least one second body is sufficient to overcome the mixing force,
    wherein the first magnetic field has a first polarity extending from a first contact surface of the one of the at least one first body due to a corresponding first at least one magnet, wherein the second magnetic field has a second polarity extending from a second contact surface of the one of the at least one second body due to a corresponding second at least one magnet, wherein the first contact surface and the second contact surface contact each other upon bonding together of the one of the at least one first body and the one of the at least one second body, wherein the first at least one magnet and the second at least one magnet do not overlap upon bonding together of the one of the at least one first body and the one of the at least one second body, wherein the first at least one magnet does not overlap with any magnet creating a magnetic field extending from the second contact surface upon bonding together of the one of the at least one first body and the one of the at least one second body, wherein the second at least one magnet does not overlap with any magnet creating a magnetic field extending from the first contact surface upon bonding together of the one of the at least one first body and the one of the at least one second body.

16. A structure adapted for magnetically-directed, self-assembly, comprising:
    a first body, the first body exhibiting a first magnetic field having a first predetermined pattern; and
    a second body, the second body exhibiting a second magnetic field having a second predetermined pattern, wherein the first body and the second body are fully aligned to each other and bonded together by a magnetic attraction force between the first body and the second body due to the first and second magnetic fields when the magnetic attraction force between the first body and the second body is sufficient to overcome a mixing force while the first body is free-floating, wherein the first body comprises one or more hard magnet and/or soft magnet that is removable after bonding together of the first body and the second body.

17. The structure according to claim 16, wherein the one or more hard magnet and/or soft magnet that is removable is removable via etching.

18. The structure according to claim 16, wherein the at least one second body is bonded to a front side of the at least one first body, wherein the one or more hard magnet and/or soft magnet is positioned on a back side of the at least one first body.

19. The structure according to claim 18, wherein the one or more hard magnet and/or soft magnet that is removable is removable via etching.

20. The structure according to claim 18, wherein the one or more hard magnet and/or soft magnet is mechanically removable.

21. The structure according to claim 18, wherein the one or more hard magnet and/or soft magnet is removable via chemical mechanical polishing.

22. The structure according to claim 18, wherein the first body comprises a silicon on insulation (SOI) wafer and a handle wafer, wherein the one or more hard magnet and/or soft magnet is removable by etching a buried oxide layer.

23. The structure according to claim 16, wherein the first body comprises one or more hard magnet that is removable after bonding together of the first body and the second body.

24. The structure according to claim 16, wherein the first body and the second body are fully aligned to each other and bonded together by a magnetic attraction force between the first body and the second body due to the first and second magnetic fields when the magnetic attraction force between the first body and the second body is sufficient to overcome a mixing force while the first body is free-floating, and the second body is free-floating.

25. A structure adapted for magnetically-directed, self-assembly, comprising:
a first body, the first body exhibiting a first magnetic field having a first predetermined pattern, wherein the first magnetic field is at least in part created by a first assembly magnet and a first alignment magnet; and
a second body, the second body exhibiting a second magnetic field having a second predetermined pattern, wherein the second magnetic field is at least partially created by a second assembly magnet and a second alignment magnet, wherein magnetic attraction between the first assembly magnet and the second assembly magnet causes bonding between the one of the at least one first body and the one of the at least one second body, wherein after bonding between the one of the at least one first body and the one of the at least one second body, magnetic attraction between the first alignment magnet and the second alignment magnet tends to align the one of the at least one first body and the one of the at least one second body, wherein the first body and the second body are bonded together by a magnetic attraction force between the first body and the second body due to the first and second magnetic fields when the magnetic attraction force between the first body and the second body is sufficient to overcome a mixing force, wherein the magnetic attraction between the first assembly magnet and the second assembly magnet is sufficient to overcome the mixing force, wherein the magnetic attraction between the first assembly magnet and the second assembly magnet does not tend to align the one of the at least one first body and the one of the at least one second body.

26. The structure according to claim 25, wherein the first assembly magnet is larger than the first alignment magnet and the second assembly magnet is larger than the second alignment magnet.

27. The structure according to claim 25, wherein the first alignment magnet and the second alignment magnet provide angular alignment.

28. The structure according to claim 25, wherein the first alignment magnet and the second alignment magnet provide lateral alignment.

29. A structure adapted for magnetically-directed, self-assembly, comprising:
a first body, the first body exhibiting a first magnetic field having a first predetermined pattern; and
a second body, the second body exhibiting a second magnetic field having a second predetermined pattern, wherein the first body and the second body are fully aligned to each other and bonded together by a magnetic attraction force between the first body and the second body due to the first and second magnetic fields when the magnetic attraction force between the first magnetic field of the first body and the second magnetic field of the second body is sufficient to overcome a mixing force, wherein the first magnetic field has a first polarity extending from a first contact surface of the one of the at least one first body due to a corresponding first at least one magnet, wherein the second magnetic field has a second polarity extending from a second contact surface of the one of the at least one second body due to a corresponding second at least one magnet, wherein the first polarity is the same as the second polarity, wherein the first contact surface and the second contact surface contact each other upon bonding together of the one of the at least one first body and the one of the at least one second body, wherein the first at least one magnet and the second at least one magnet do not overlap upon bonding together of the one of the at least one first body and the one of the at least one second body, wherein the first at least one magnet does not overlap with any magnet creating a magnetic field extending from the second contact service upon bonding together of the one of the at least one first body and the one of the at least one second body, wherein the second at least one magnet does not overlap with any magnet creating a magnetic field extending from the first contact surface upon bonding together of the one of the at least one first body and the one of the at least one second body.

* * * * *